United States Patent
Bomberger et al.

(10) Patent No.: US 12,027,585 B2
(45) Date of Patent: *Jul. 2, 2024

(54) SOURCE OR DRAIN STRUCTURES WITH LOW RESISTIVITY

(71) Applicant: Intel Corporation, Santa Clara, CA (US)

(72) Inventors: Cory Bomberger, Portland, OR (US); Anand Murthy, Portland, OR (US); Suresh Vishwanath, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/110,315

(22) Filed: Feb. 15, 2023

(65) Prior Publication Data

US 2023/0197785 A1 Jun. 22, 2023

Related U.S. Application Data

(63) Continuation of application No. 16/368,097, filed on Mar. 28, 2019, now Pat. No. 11,621,325.

(51) Int. Cl.
*H01L 29/08* (2006.01)
*B82Y 10/00* (2011.01)
(Continued)

(52) U.S. Cl.
CPC .... *H01L 29/0847* (2013.01); *H01L 21/02532* (2013.01); *H01L 21/823418* (2013.01);
(Continued)

(58) Field of Classification Search
CPC ........... H01L 29/0673; H01L 29/66439; H01L 21/762; H01L 21/76224–76237;
(Continued)

(56) References Cited

U.S. PATENT DOCUMENTS 10,032,873 B2 7/2018 Chang
10,355,137 B2 * 7/2019 Ching ............... H01L 29/66742
(Continued)

OTHER PUBLICATIONS

Office Action from Taiwan Patent Application No. 109105438, mailed Aug. 31, 2023, 18 pgs.
(Continued)

*Primary Examiner* — Sonya McCall-Shepard
(74) *Attorney, Agent, or Firm* — Schwabe, Williamson & Wyatt P.C.

(57) ABSTRACT

Integrated circuit structures having source or drain structures with low resistivity are described. In an example, integrated circuit structure includes a fin having a lower fin portion and an upper fin portion. A gate stack is over the upper fin portion of the fin, the gate stack having a first side opposite a second side. A first source or drain structure includes an epitaxial structure embedded in the fin at the first side of the gate stack. A second source or drain structure includes an epitaxial structure embedded in the fin at the second side of the gate stack. Each epitaxial structure of the first and second source or drain structures include silicon, germanium and boron. The first and second source or drain structures have a resistivity less than or equal to 0.3 mOhm·cm.

20 Claims, 16 Drawing Sheets

(51) Int. Cl.

| | |
|---|---|
| *H01L 21/02* | (2006.01) |
| *H01L 21/8234* | (2006.01) |
| *H01L 23/00* | (2006.01) |
| *H01L 27/088* | (2006.01) |
| *H01L 27/092* | (2006.01) |
| *H01L 29/06* | (2006.01) |
| *H01L 29/16* | (2006.01) |
| *H01L 29/161* | (2006.01) |
| *H01L 29/165* | (2006.01) |
| *H01L 29/36* | (2006.01) |
| *H01L 29/40* | (2006.01) |
| *H01L 29/417* | (2006.01) |
| *H01L 29/66* | (2006.01) |
| *H01L 29/775* | (2006.01) |
| *H01L 29/78* | (2006.01) |

(52) U.S. Cl.
CPC ............ *H01L 21/823431* (2013.01); *H01L 21/823437* (2013.01); *H01L 21/823468* (2013.01); *H01L 21/823475* (2013.01); *H01L 24/09* (2013.01); *H01L 24/17* (2013.01); *H01L 27/0886* (2013.01); *H01L 29/0649* (2013.01); *H01L 29/16* (2013.01); *H01L 29/66545* (2013.01); *H01L 29/66795* (2013.01); *H01L 29/785* (2013.01); *H01L 2029/7858* (2013.01); *H01L 2224/0401* (2013.01)

(58) Field of Classification Search
CPC ..... H01L 21/823481; H01L 21/823878; H01L 29/0649–0653; H01L 29/42392; H01L 21/823418; H01L 29/165; H01L 29/7848; H01L 29/41783; H01L 29/66636; H01L 29/823814; H01L 21/823437; H01L 21/823468; H01L 29/78618; H01L 2029/7858

See application file for complete search history.

(56) References Cited

U.S. PATENT DOCUMENTS

| | | |
|---|---|---|
| 2006/0197164 A1 | 9/2006 | Lindert et al. |
| 2013/0011984 A1 | 1/2013 | Wang |
| 2017/0077305 A1 | 3/2017 | Chang et al. |
| 2018/0096934 A1 | 4/2018 | Siew |
| 2020/0105932 A1 | 4/2020 | Li |
| 2020/0135874 A1 | 4/2020 | Shih |
| 2020/0176565 A1 | 6/2020 | Ting |

OTHER PUBLICATIONS

Notice of Allowance from Taiwan Patent Application No. 109105438, mailed Dec. 22, 2023, 3 pgs.

* cited by examiner

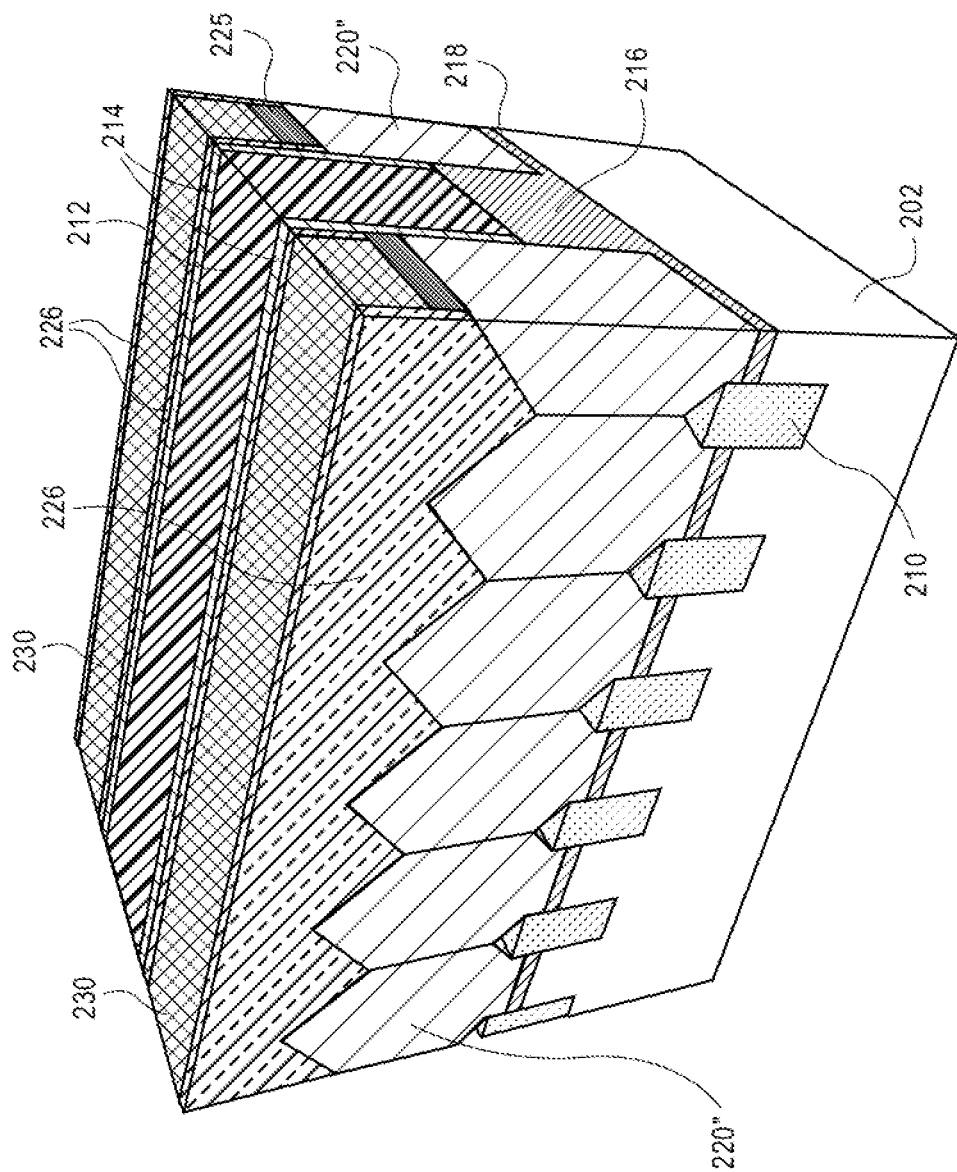
FIG. 2G"

SOURCE OR DRAIN STRUCTURES WITH LOW RESISTIVITY

CROSS-REFERENCE TO RELATED APPLICATIONS

This application is a continuation of U.S. patent application Ser. No. 16/368,097, filed on Mar. 28, 2019, the entire contents of which is hereby incorporated by reference herein.

TECHNICAL FIELD

Embodiments of the disclosure are in the field of advanced integrated circuit structure fabrication and, in particular, integrated circuit structures having source or drain structures with low resistivity.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

BRIEF DESCRIPTION OF THE DRAWINGS

FIG. 2G' illustrates a cross-sectional view of another integrated circuit structure having source or drain structures with low resistivity, in accordance with another embodiment of the present disclosure.

FIG. 2G" illustrates a cross-sectional view of another integrated circuit structure having source or drain structures with low resistivity, in accordance with another embodiment of the present disclosure.

DESCRIPTION OF THE EMBODIMENTS

Figure 1B:
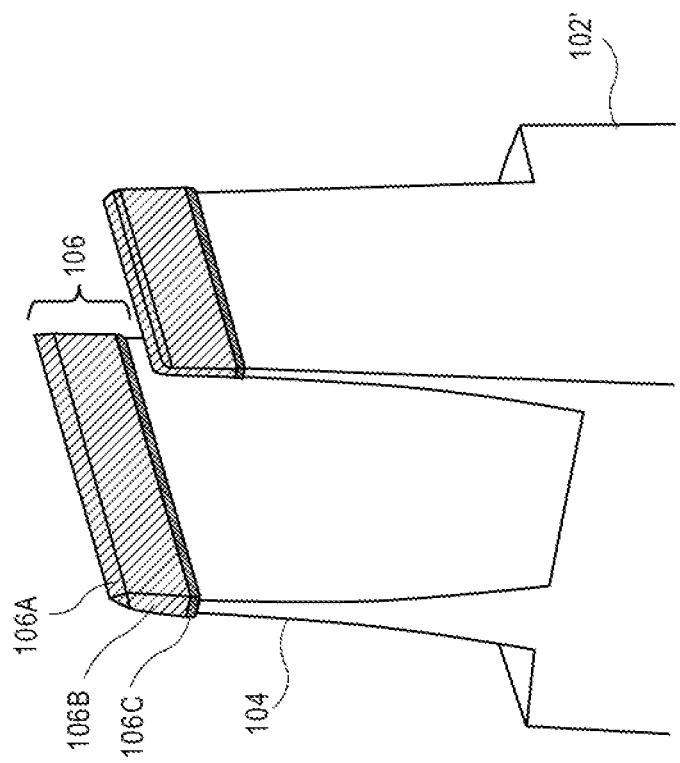
FIGS. 1A-1D illustrate cross-sectional views representing various operations in a method of fabricating an integrated circuit structure having source or drain structures with low resistivity, in accordance with an embodiment of the present disclosure.

Integrated circuit structures having source or drain structures with low resistivity, and methods of fabricating source or drain structures with low resistivity, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled." The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit." As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with one or more embodiments of the present disclosure, PMOS transistors with ultra-low resistivity source or drain (Source/Drain, S/D) structures are described.

To provide context, typical PMOS source or drain structures suffer from either having high resistance (e.g., greater than 0.4 mOhm·cm) or lack of selectivity. State-of-the-art solutions include attempts to incorporate more dopant atoms than are needed, and activating the dopant atoms with thermal anneals during downstream processing. However, excessive chemical doping can cause defects in a source or drain structure, reducing the ability of the source or drain structure to strain an adjacent channel region. Additionally, such thermal anneals may have to be controlled or restricted in order to prevent dopant atom diffusion to extents that may not be suitable for other features of an integrated circuit. Also, any dopants activated by a thermal anneal may be subject to deactivation at later processing operations.

In accordance with an embodiment of the present disclosure, a suitable selection of precursor and process conditions are implemented to achieve a selective PMOS source or drain structure with a resistivity less than or equal to 0.3 mOhm·cm, e.g., between 0.2 and 0.3 mOhm·cm. Embodiments described herein may provide a source or drain structure having relatively much lower external resistance, leading to improved transistor performance. In an embodiment, the external resistance of an associated transistor is be minimized, leading to increased current flow in the channel, and an overall performance increase. Additionally, embodiments may involve a high active doping level as-deposited to allow for removal or reduction of later activation anneals. Embodiments may be implemented to minimize any diffusion of dopant which allows for a more abrupt junction. In accordance with embodiments described herein, a source or drain structure with a chemical concentration equal to or essentially equal to the maximum active dopant concentration for the source or drain semiconductor material reduces or eliminates the risk or defect formation in the source or drain structure, resulting in an increased strain in the channel and an increased channel mobility. Additionally, any extra non-active dopant atoms in the source drain will act as a scattering site in the source/drain and reduce the mobility within the source or drain.

In accordance with one or more embodiments of the present disclosure, low resistivity source or drain structure fabrication may be incorporated into a typical PMOS transistor processing scheme. During source or drain material deposition, however, precursor selection and process conditions are chosen to enable for a selective PMOS source drain deposition with a low resistivity (e.g., less than 0.3 mOhm·cm) as-deposited. Embodiments of the present disclosure may be detectable by the presence of an ultra-low resistivity PMOS source or drain structure based on the combination of SIMS and or APT showing a source drain composition of SiGe:B with Ge ranging from 10 to 85% and B from about 1E20 to 3E21 cm$^3$ in combination with low external resistance from device measurement, and resistivity between, e.g., 0.2 and 0.3 mOhm·cm as measured by a Pico probe. Additionally, XSEM and XTEM analysis may reveal the absence of any nodules from PMOS source or drain growth.

In accordance with an embodiment of the present disclosure, an ultra-low resistivity PMOS source or drain structure described herein can be fabricated as accompanying strained or unstrained silicon (Si) channels, strained or unstrained silicon germanium (SiGe) channels, or strained or unstrained germanium (Ge) channels. Processing schemes incorporating the fabrication of ultra-low resistivity PMOS source or drain structure described herein may be gate first or gate last approaches. Embodiments may be applicable for use with nanowires, nanoribbons, fins, and planar transistors. Embodiments may be applicable for use with stacked CMOS or transistors where backend contacts are made from the backside of the wafer through a via. Embodiments may include the fabrication of an accompanying higher Ge % (e.g., up to 100% Ge) cap deposited on top of an ultra-low resistivity film when a via for a contact is opened at trench contact (TCN) formation, or immediately after source or drain deposition, to provide ultra-low resistivity PMOS source or drain structures including a capping layer.

As an exemplary process flow, FIGS. 1A-1D illustrate cross-sectional views representing various operations in a method of fabricating an integrated circuit structure having source or drain structures with low resistivity, in accordance with an embodiment of the present disclosure.

Figure 1A:
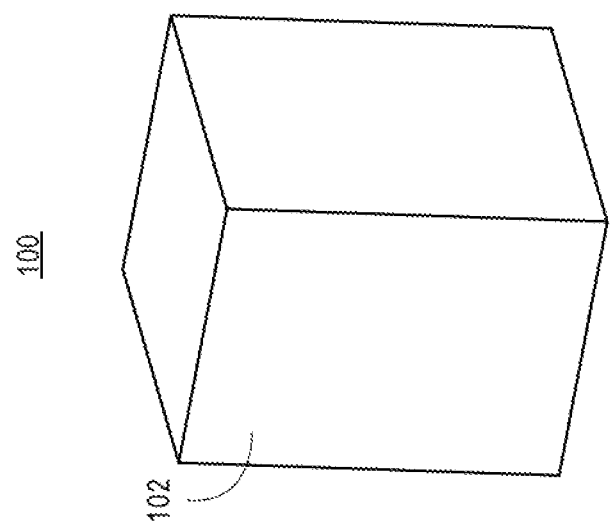
Figure 1D:
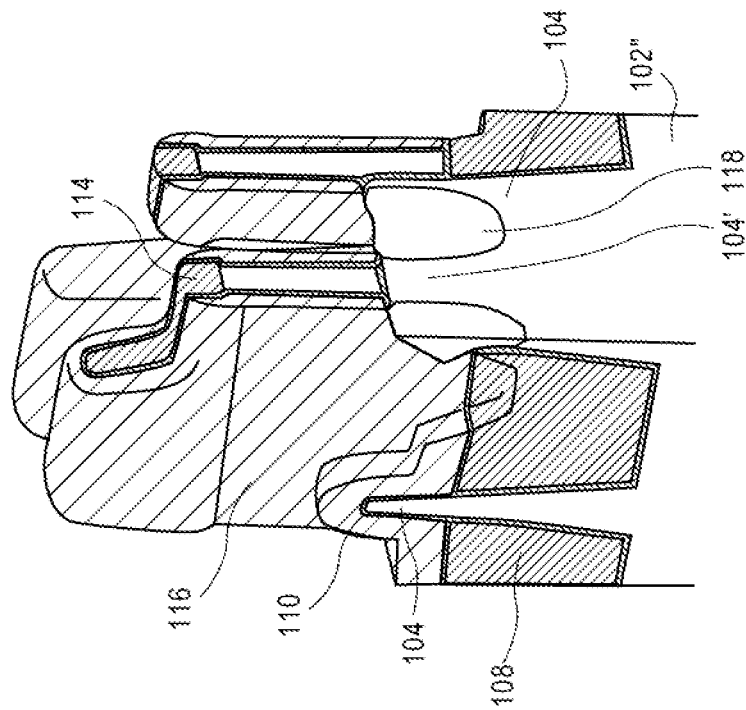
Figure 1C:
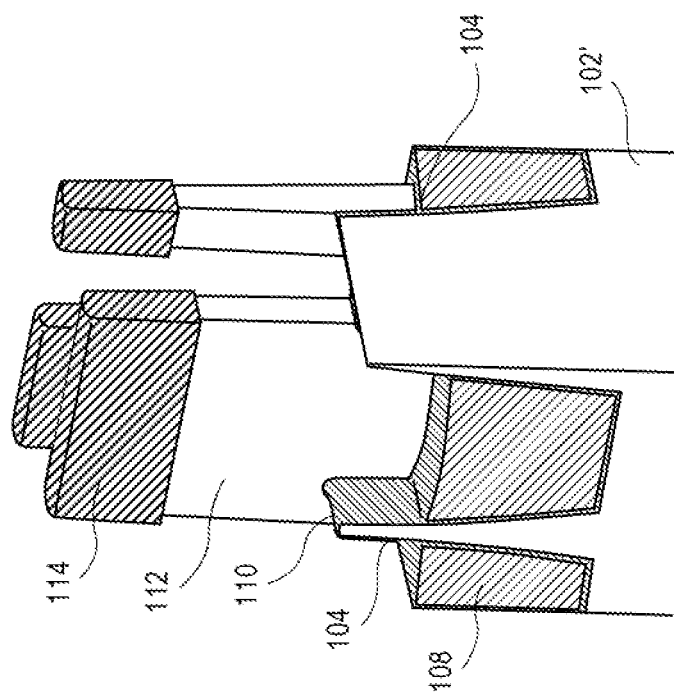

Referring to FIG. 1A, a starting structure 100 includes a substrate 102, such as a silicon substrate. A patterned mask 106 including a stack of masking layers 106A, 106B and 106C is then formed on the substrate 102, as is depicted in FIG. 1B. The patterned mask 106 is used to pattern fins 104 into substrate 102, forming patterned substrate 102'. Referring to FIG. 1C, a shallow trench isolation (STI) structure 108 is formed between lower fin 104 portions. A dummy gate structure including a dummy gate dielectric 110, dummy gate electrode 112, and hardmask layer 114, is formed over the upper portions of fins 104 protruding through STI structure 108. Spacers 116 are then formed along gate sidewalls and over some fin portions while exposing other fin portions. As depicted in FIG. 1D. The exposed fin portions are then etched to form twice patterned substrate 102" with channel regions 104', and epitaxial ultra-low resistivity source or drain structures 118 therein. Subsequent processing may include the replacement of the dummy gate structure with a high-k gate dielectric layer and metal gate electrode.

A source or drain structures with low resistivity as described herein may be grown on or within planar, trigate, FinFET, nanowire, or nanoribbon structures with minimal modification to a baseline process flow. In an embodiment, an entire epitaxial structure of a source or drain structure is composed of a single ultra-low resistivity film, an example of which is described below in association with FIG. 2G'. It is to be appreciated that, however, an ultra-low resistivity film could instead be used in the tips only, or at a lower structural portion only, with boron-doped high-content germanium fill and/or cap formed thereon, examples of which are described below in association with FIGS. 2G and 2G".

One or more embodiments described herein are directed to fabrication processes and structures including low resistivity source or drain structures with a cap grown thereon, examples of which are described in association with FIGS. 2A-2G. One or more embodiments described herein are directed to fabrication processes and structures including low resistivity source or drain structures without a capping layer, examples of which are described in association with FIGS. 2A-2D, and 2G'. One or more embodiments described herein are directed to fabrication processes and structures including low resistivity source or drain structures with a cap grown thereon, the cap fabricated during contact opening, examples of which are described in association with FIGS. 2A-2D, and 2G".

Figure 2A:
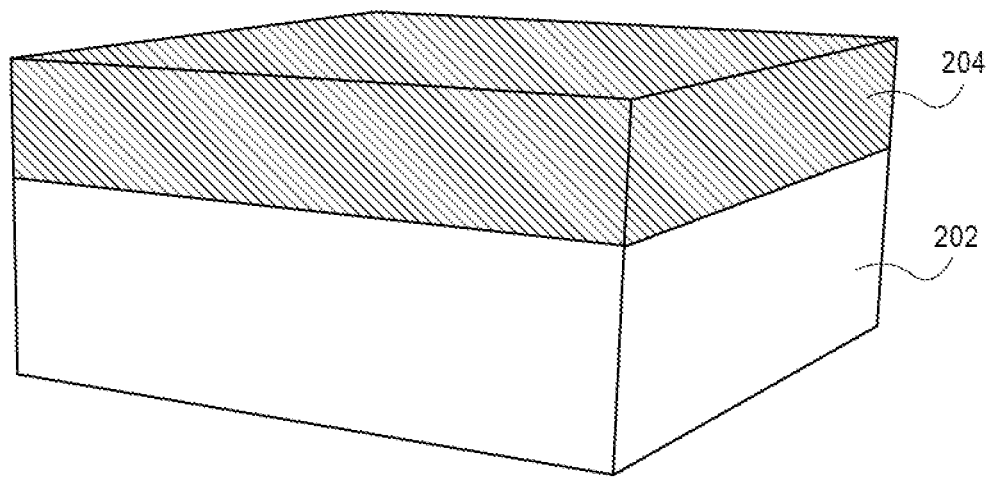
FIGS. 2A-2G illustrate cross-sectional views representing various operations in a method of fabricating an integrated circuit structure having source or drain structures with low resistivity, in accordance with an embodiment of the present disclosure.
Figure 2B:
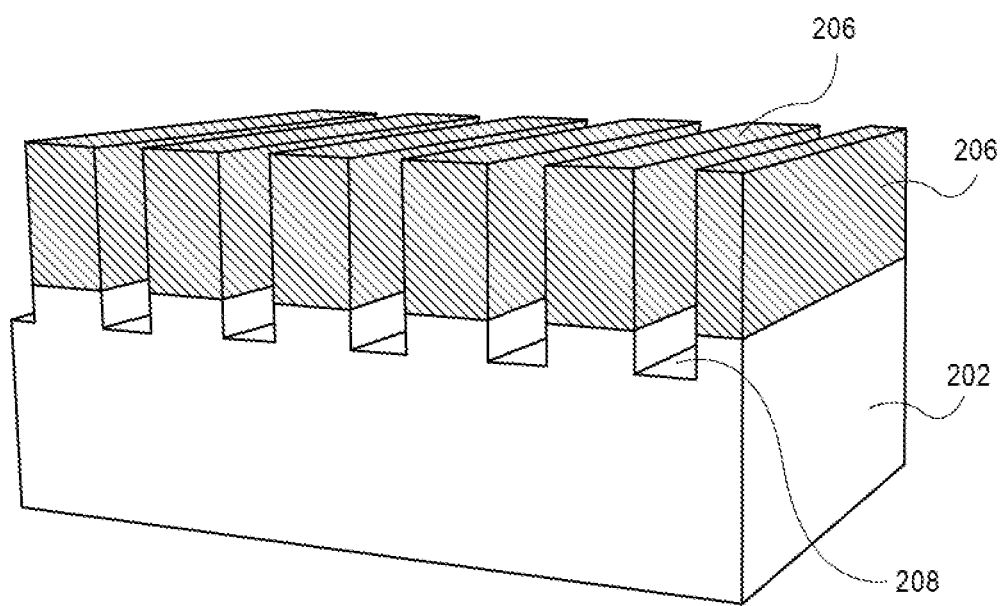
Figure 2C:
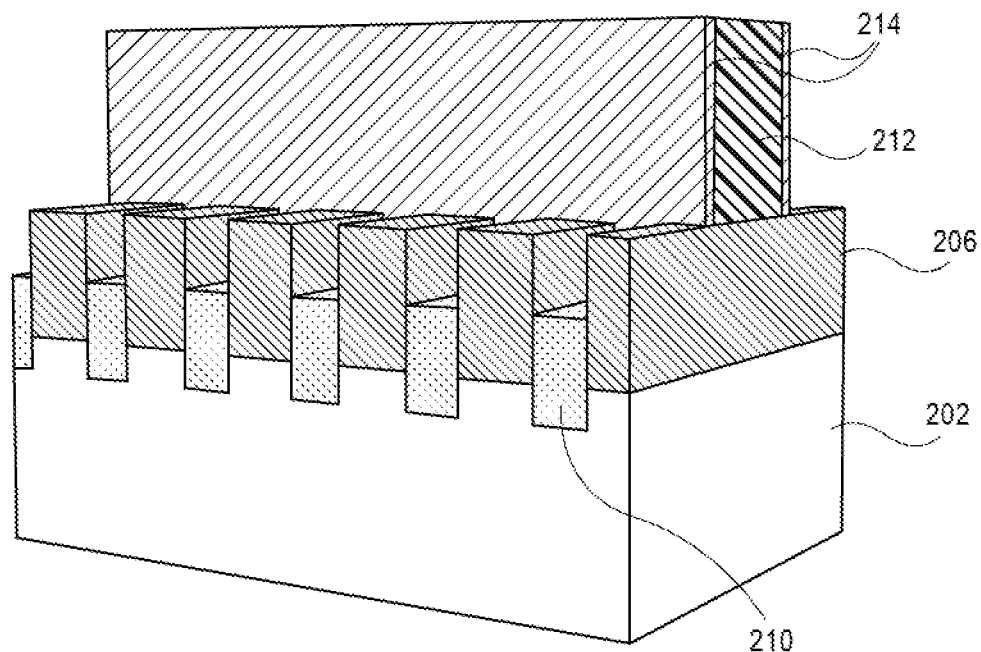
Figure 2D:
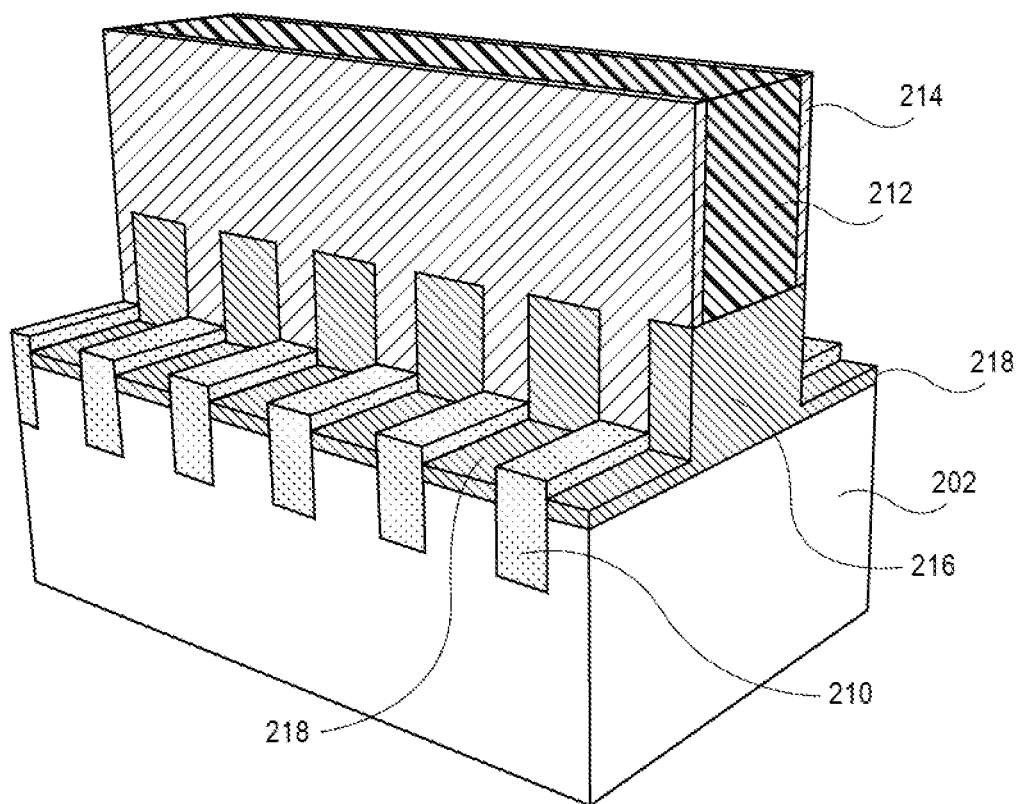
Figure 2E:
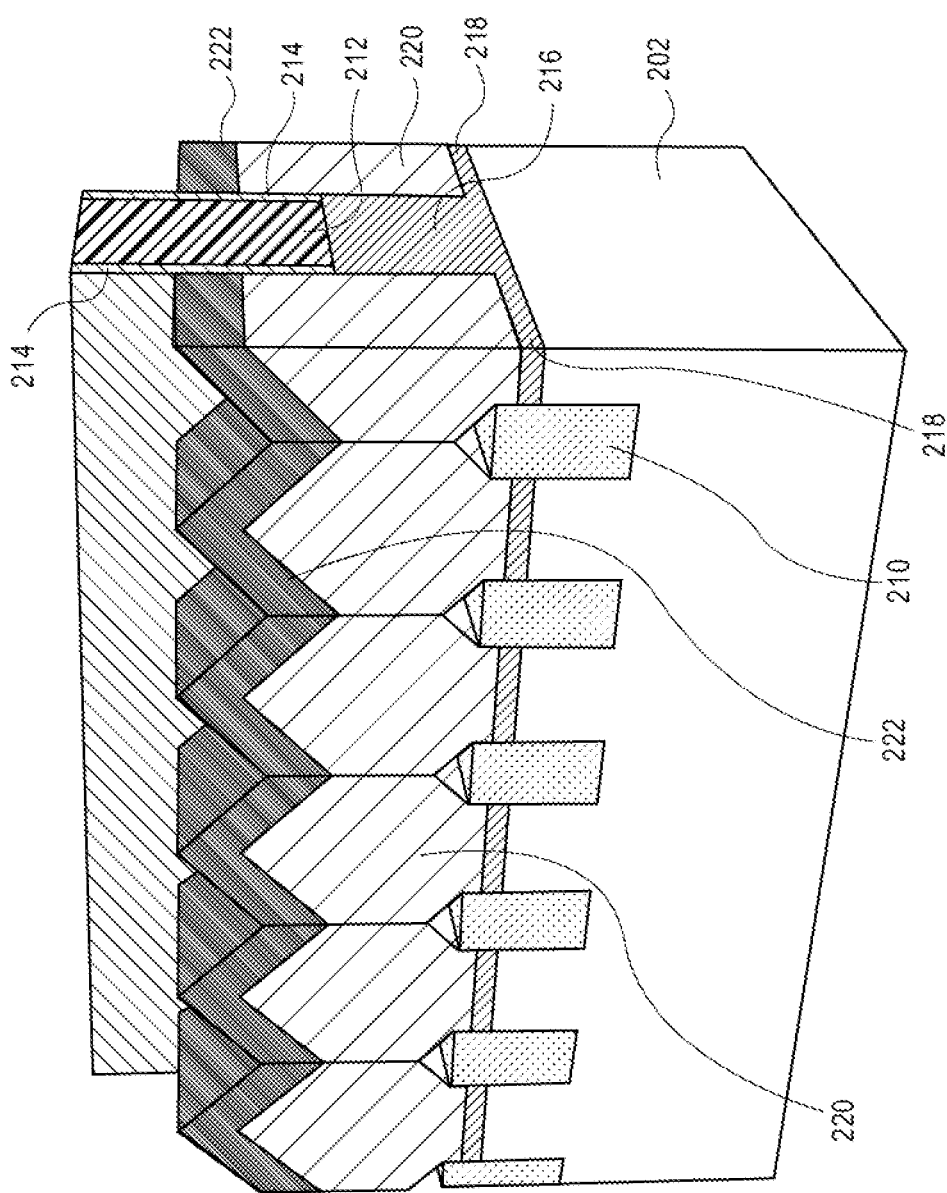
Figure 2F:
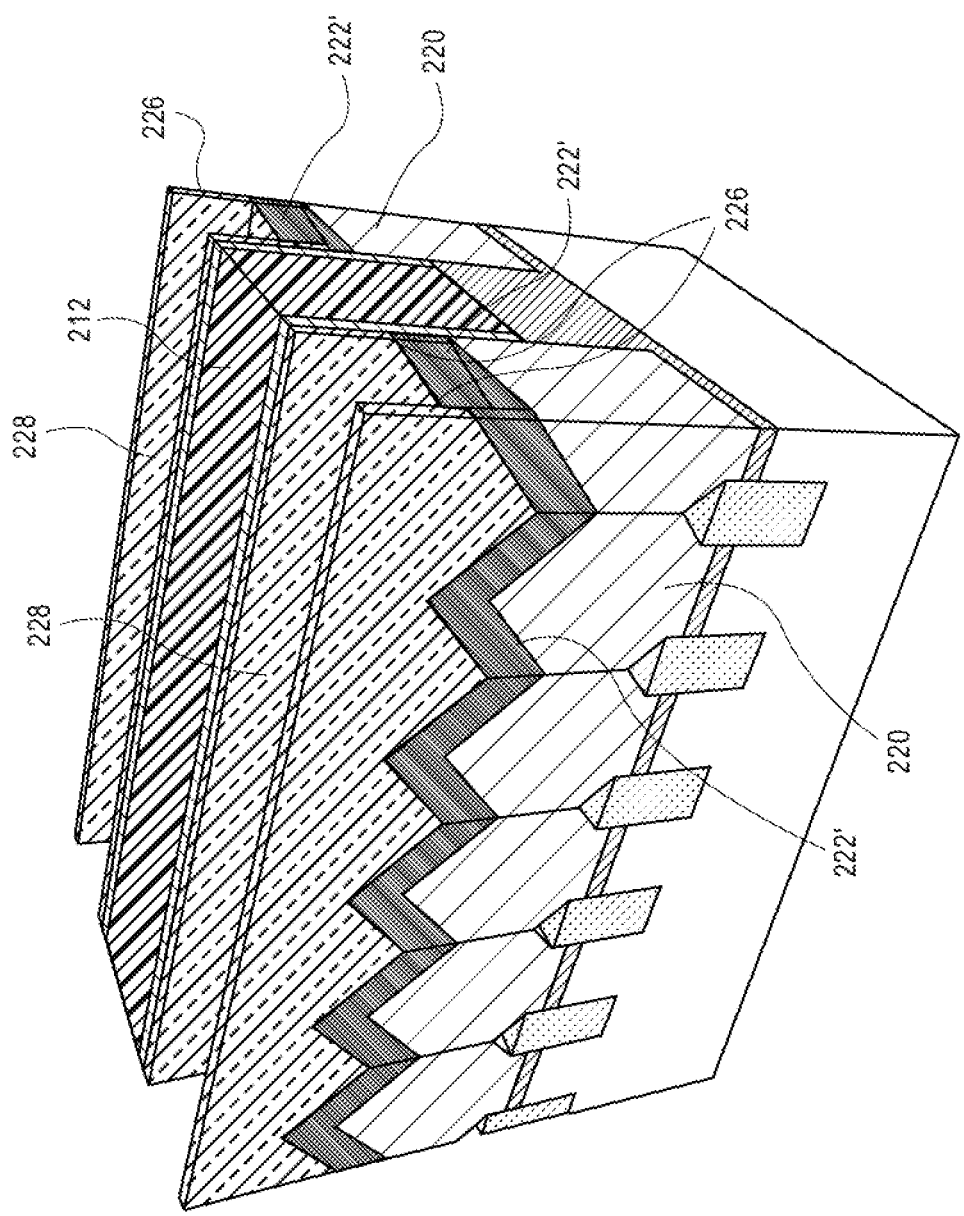
Figure 2G:
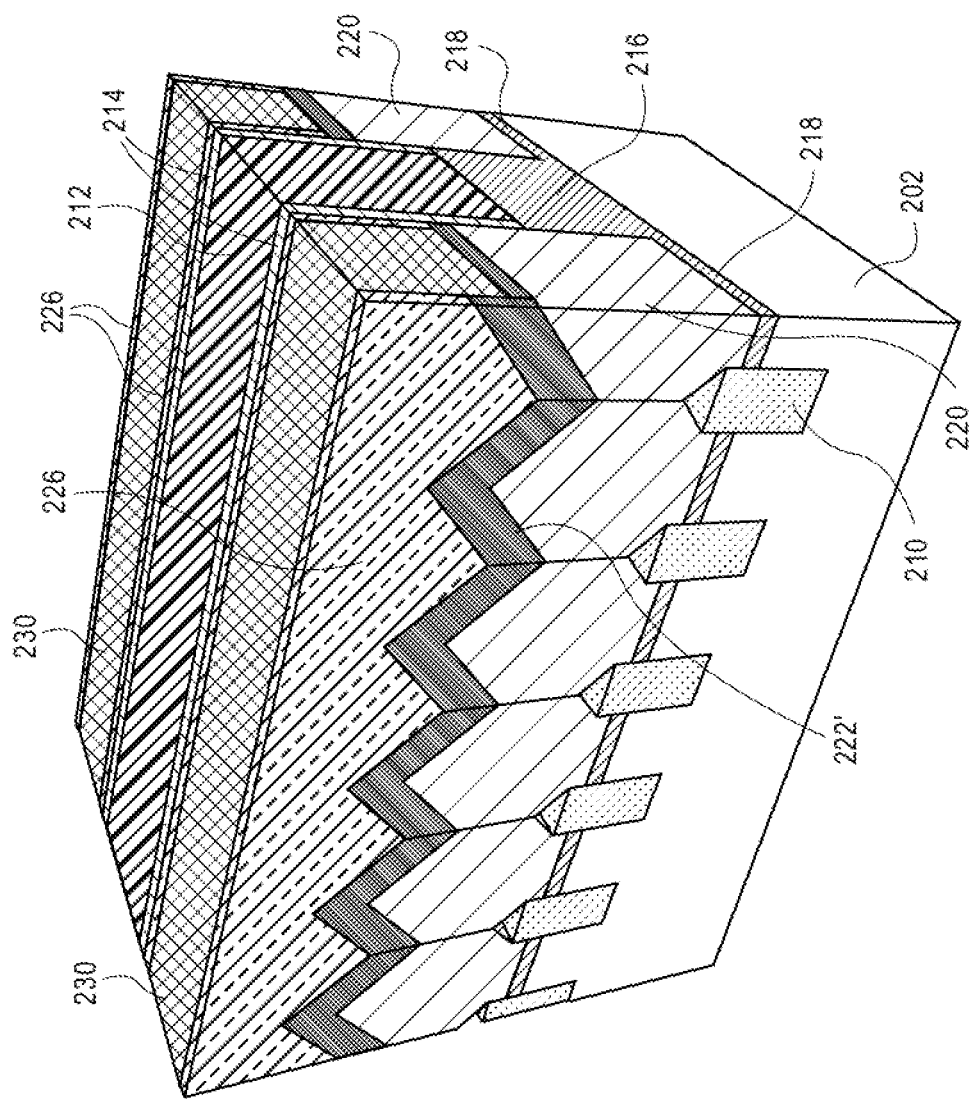
Figure 2G:
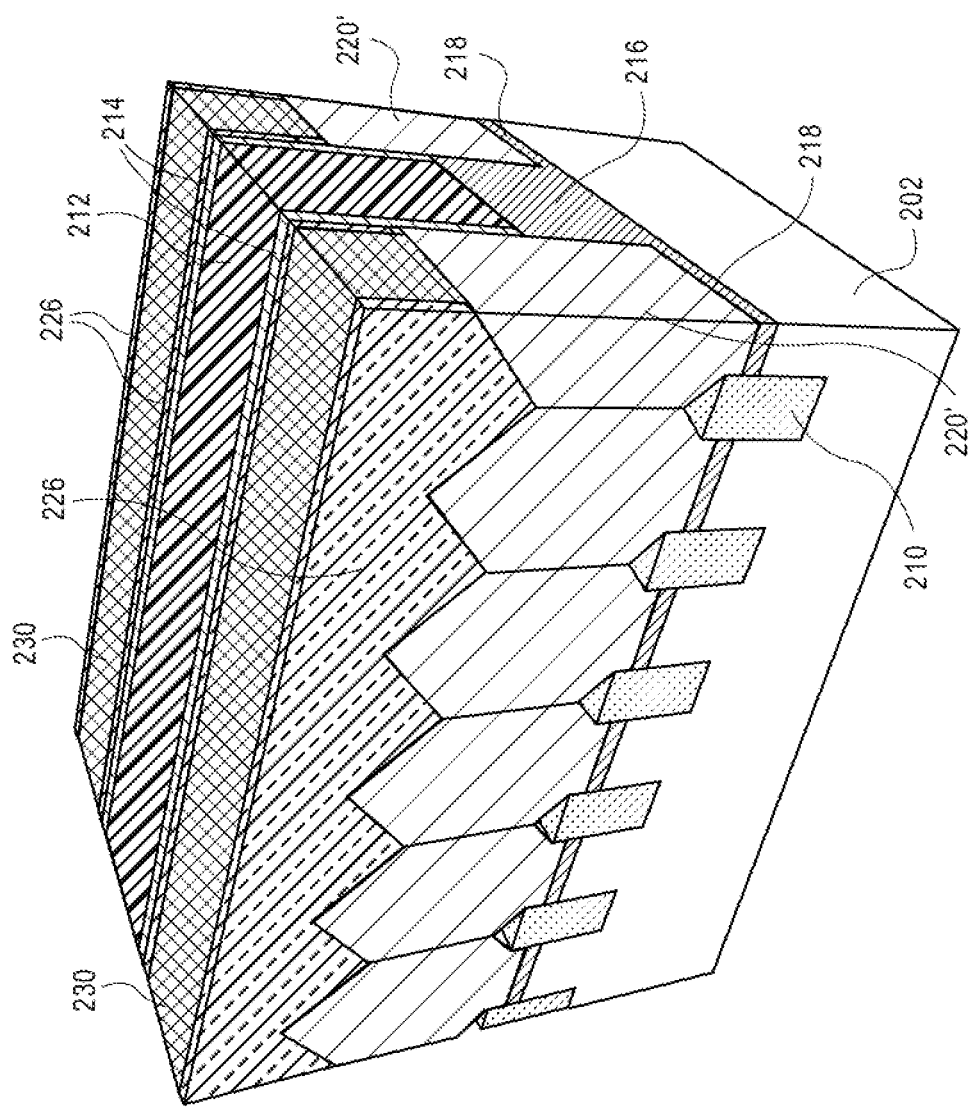

As an exemplary process flow, FIGS. 2A-2G illustrate cross-sectional views representing various operations in a method of fabricating an integrated circuit structure having source or drain structures with low resistivity, in accordance with an embodiment of the present disclosure. FIG. 2G' illustrates a cross-sectional view of another integrated circuit structure having source or drain structures with low resistivity, in accordance with another embodiment of the present disclosure. FIG. 2G" illustrates a cross-sectional view of another integrated circuit structure having source or drain structures with low resistivity, in accordance with another embodiment of the present disclosure.

Referring to FIG. 2A, optionally, a channel material 204 is grown on a substrate 202, such as a silicon substrate. In an embodiment, the channel material 204 includes silicon. In an embodiment, the channel material 204 includes silicon and germanium. In an embodiment, the channel material 204 includes germanium. In an embodiment, the channel material 204 is a Group III-V material. In other embodiments, a distinct channel material 204 is not formed, and the following described process operations are performed on a surface of substrate 202.

Referring to FIG. 2B, channel material 204 is patterned into fins 206. The patterning may form recesses 208 into substrate 202, as is depicted.

Referring to FIG. 2C, trenches between the fins 206 are filled with a shallow trench isolation material which is then polished and recessed to form isolation structures 210. The process may further involve deposition, patterning and recessing of a dielectric isolation barrier. The process continues with deposition and patterning of gate oxide material and gate electrode material (which may be a dummy gate oxide material and dummy gate electrode material), and the formation of gate spacers to form gate stack 212 and gate spacers 214.

Referring to FIG. 2D, fins 206 are etched adjacent sides of gate stack 212 at locations 218. The etching leaves channel regions 216 beneath gate stack 212.

Referring to FIG. 2E, source or drain structure formation involves growth of a lower source or drain material 220, and a capping semiconductor layer 222 (which may be grown in situ). Alternatively, a capping semiconductor layer 222 is not grown, an exemplary resulting structure for which is described in association with FIG. 2G'. In either case, in an embodiment, the source or drain structures include silicon, germanium and boron. In an embodiment, the source or drain structures are composed of silicon germanium doped with boron atoms during deposition (e.g., in situ). In one such embodiment, the boron atoms are activated as impurity atoms, e.g., substitutionally incorporated into a silicon germanium lattice during the in situ deposition. That is, a high concentration of activated boron dopants is achieved at deposition, which is in contrast to typical interstitial boron inclusion with a need for subsequent annealing to effect incorporation and activation.

In an embodiment, the in situ deposition of a low resistivity silicon germanium source or drain material with activated boron dopants incorporated therein during deposition involves use of a silicon precursor, a germanium precursor, and a boron precursor. In one embodiment, the silicon precursor is one such as, but need not be limited to, $SiH_4$, $Si_2H_6$, $CSiH_6$, $C_6H_{16}Si$, $CH_3SiH_3$, $(Si(CH_3)_2)_6$, $(Si(CH_3)_3)_2$, $[(CH_3)_3C]_2SiH_2$, $[(CH_3)_2N]_2Si(CH_3)_2$, $[NH(C_4H_9)]_2SiH_2$, $C_8H_{22}N_2Si$, $C_8H_{23}NSi_2$, $C_7H_{19}NSi$, dichlorosilane (DCS), trichlorosilane (TCS), $SiCl_4$, $CH_3(CH_2)_3SiCl_3$, $(CH_3)_3SiNHSi(CH_3)_3$, $(CH_3)_3SiSi(CH_3)_2Cl$, [ClSi$(CH_3)_2]_2$, $C_2H_6Cl_2Si$, $Cl_2H_{10}Cl_2Si$, $C_2H_5C_{13}Si$, $CH_3SiHCl_2$, $CH_3Cl_3Si$, or $SiBr_4$. In one embodiment, the germanium precursor is one such as, but need not be limited to, $GeH_4$, $Ge_2H_6$, $GeCl_4$, $GeBr_4$, $GeI_2$, $C_{16}H_{36}Ge$, $(CH_3)_4Ge$, $(CH_3)_3GeGe(CH_3)_3$, $CH_3(CH_2)_3]_3GeH$, $(C_2H_5)_3GeH$, $(C_6H_5)_3GeH$, $(CH_3)_3GeCl$, $(CH_3)_2GeCl_2$, $C_2H_5GeCl_3$, $(C_6H_5)_3GeCl$, $(CH_3)_3GeBr$, or $GeF_4$. In one embodiment, the boron precursor is one such as, but need not be limited to, $B_2H_6$, $B_{10}H_{14}$, $BBr_3$, $BCl_3$, $BF_3$, $B_2F_4$, $C_{18}F_{15}B$, $B_3C_{13}H_3N_3$, trimethylborane (TMB), triethylborane, $B(CD_3)_3$, $C_3H_9B$, $C_6H_{15}B$, $C_{18}H_{15}B$, $C_{12}H_{24}B_2O_4$, $[(CH_3)_2CHO]_3B$, $[(CH_3)_3CO]_3B$, $C_{10}H_{19}BClNSi$, or $[(CH_3)_2N]_2BB[N(CH_3)_2]_2$. In a particular embodiment, $BCl_3$ is used as the boron precursor, and the source or drain material is formed at a deposition temperature of between 400-850 degrees Celsius, and in a particular embodiment about 700 degrees Celsius, together with a silicon precursor, a germanium precursor, and hydrogen chloride (HCl) as a co-deposition gas.

Referring to FIG. 2F, an isolation material is formed on the source or drain structures of FIG. 2E. The isolation material is then patterned and recessed to expose the source or drain structures and to form secondary spacers 226 and trenches 228. In one embodiment, the recessing of the isolation material is performed using an etch process which stops on or partially into the capping semiconductor layer 222 where, in the latter case, a patterned source or drain capping semiconductor layer 222' is formed. In another embodiment, in the case that a capping semiconductor layer 222 is not implemented, an etch process stops on or partially into a source or drain material 220.

Referring to FIG. 2G, source or drain contact material deposition and patterning is performed to form conductive contacts 230. In an embodiment, the conductive contacts 230 are on the capping semiconductor layer 222 or 222' of the first and second source or drain structures. In one such embodiment, the first and second conductive contacts 230 are in a partial recess in the capping semiconductor layers 222' of the first and second source or drain structures. It is to be appreciated that, although not depicted, back end processing may then be performed on the structure of FIG. 2G.

With reference again to FIG. 2G, in accordance with an embodiment of the present disclosure, an integrated circuit structure has a fin (216 and patterned portion of substrate 202). The fin has a lower fin portion (portion of 216 and patterned portion of 202 below top surface of isolation structure 210) and an upper fin portion (portion of 216 above top surface of isolation structure 210). A gate stack 212 is over the upper fin portion of the fin, the gate stack 212 having a first side opposite a second side. A first source or drain structure includes an epitaxial structure embedded in the fin at the first side of the gate stack (e.g., left-hand side of gate stack 212). A second source or drain structure includes an epitaxial structure embedded in the fin at the second side of the gate stack (e.g., right-hand side of gate stack 212). The epitaxial structures of the first and second source or drain structures include a lower semiconductor layer 220 and a capping semiconductor layer 222' (or 222 of FIG. 2E in the case of no recess). In an embodiment, the lower semiconductor layer 220 of each of the epitaxial structures of the first and second source or drain structures include silicon, germanium and boron. The capping semiconductor layer 222' or 222 of the epitaxial structure of each of the first and second source or drain structures has a germanium concentration greater than the lower semiconductor layer 220. The first and second source or drain structures having a resistivity less than or equal to 0.3 mOhm·cm.

With respect to FIG. 2G, in an embodiment, the lower semiconductor layer 220 of each of the epitaxial structures of the first and second source or drain structures have an atomic concentration of boron in the range of 1E20 atoms/$cm^3$-3E21 atoms/$cm^3$, and a germanium concentration in the range of 10% to 85%. In an embodiment, the capping semiconductor layer 222' or 222 has a germanium concentration greater than 50%. In an embodiment, the capping semiconductor layer 222' or 222 consists essentially of germanium.

With respect to FIG. 2G, in an embodiment, the resistivity of the first and second source or drain structures is in the range of 0.1 mOhm·cm to 0.3 mOhm·cm. In one such embodiment, the first and second source or drain structures induce a uniaxial compressive strain on the fin. In an embodiment, the lower semiconductor layer 220 of the first and second source or drain structures are adjacent an isolation structure 210. In one such embodiment, the lower semiconductor layer 220 of the first and second source or drain structures have a lower surface below an upper surface of the isolation structure 210.

In contrast to FIG. 2G, in FIG. 2G', an embodiment is depicted where a capping semiconductor layer is not used. In particular, the source or drain structures include only a single source or drain material 220'. The conductive contacts 230 are on the single source or drain material 220' of the first and second source or drain structures. In one such embodiment, although not depicted, the first and second conductive contacts are in a partial recess in the single source or drain material 220' of the first and second source or drain structures. It is to be appreciated that, although not depicted, back end processing may then be performed on the structure of FIG. 2G'.

With reference again to FIG. 2G', in accordance with an embodiment of the present disclosure, an integrated circuit structure includes a fin (216 and patterned portion of substrate 202) having a lower fin portion (portion of 216 and patterned portion of 202 below top surface of isolation structure 210) and an upper fin portion (portion of 216 above top surface of isolation structure 210). A gate stack 212 is over the upper fin portion of the fin, the gate stack 212 having a first side opposite a second side. A first source or drain structure includes an epitaxial structure (left-hand 220') embedded in the fin at the first side of the gate stack 212. A second source or drain structure includes an epitaxial structure (right-hand 220') embedded in the fin at the second side of the gate stack 212. In an embodiment, each epitaxial structure of the first and second source or drain structures include silicon, germanium and boron, with an atomic concentration of boron in the range of 1E20 atoms/$cm^3$-3E21 atoms/$cm^3$, and a germanium concentration in the range of 10% to 85%, and the first and second source or drain structures having a resistivity less than or equal to 0.3 mOhm·cm.

With respect to FIG. 2G', in an embodiment, the resistivity of the first and second source or drain structures is in the range of 0.1 mOhm·cm to 0.3 mOhm·cm. In one such embodiment, the first and second source or drain structures induce a uniaxial compressive strain on the fin. In an embodiment, the epitaxial structures 220' of the first and second source or drain structures are adjacent an isolation structure 210. In one such embodiment, the epitaxial structures 220' of the first and second source or drain structures have a lower surface below an upper surface of the isolation structure 210.

In contrast to FIGS. 2G and 2G', in FIG. 2G", an embodiment is depicted where a capping semiconductor layer is formed after secondary spacers 226 are formed. In particular, the epitaxial structure of the first and second source or drain structures each include a capping semiconductor layer 225 on a lower semiconductor layer 220". The conductive contacts 230 are on the capping semiconductor layers 225 of the first and second source or drain structures. It is to be appreciated that, although not depicted, back end processing may then be performed on the structure of FIG. 2G".

With reference again to FIG. 2G", in accordance with an embodiment of the present disclosure, an integrated circuit structure includes a fin (216 and patterned portion of substrate 202) having a lower fin portion (portion of 216 and patterned portion of 202 below top surface of isolation structure 210) and an upper fin portion (portion of 216 above top surface of isolation structure 210). A gate stack 212 is over the upper fin portion of the fin, the gate stack 212 having a first side opposite a second side. A first source or drain structure includes an epitaxial structure embedded in the fin at the first side of the gate stack, the epitaxial structure having a lower semiconductor layer (left-hand 220") and a capping semiconductor layer (left-hand 225). A second source or drain structure includes an epitaxial structure embedded in the fin at the second side of the gate stack, the epitaxial structure having a lower semiconductor layer (right-hand 220") and a capping semiconductor layer (right-hand 225). A second source or drain structure includes a lower epitaxial source or drain structure (right-hand 220") embedded in the fin at the second side of the gate stack 212. The first and second source or drain structure include a capping semiconductor layer 225 confined between dielectric spacers 226 of conductive contacts 230. In an embodiment, the lower semiconductor layer of each of the epitaxial structures of the first and second source or drain structures includes silicon, germanium and boron, the capping semiconductor layer of the epitaxial structure of each of the first and second source or drain structures have a germanium concentration greater than the lower semiconductor layer, and the first and second source or drain structures have a resistivity less than or equal to 0.3 mOhm·cm.

In an embodiment, referring again to FIG. 2G", a first conductive contact (left-hand 230) is on the capping semiconductor layer (left-hand 225) of the first source or drain structure. A second conductive contact (right-hand 230) is on the capping semiconductor layer (right-hand 225) of the second source or drain structure. A first dielectric spacer (left-hand 226) is along sidewalls of the first conductive contact (left-hand 230), and the capping semiconductor layer (left-hand 225) of the first source or drain structure is confined between the first dielectric spacer (left-hand 226). A second dielectric spacer (right-hand 226) is along sidewalls of the second conductive contact (right-hand 230), and the capping semiconductor layer (right-hand 225) of the second source or drain structure is confined between the second dielectric spacer (right-hand 226). In one embodiment, not depicted, the capping semiconductor layer 225 is in a partial recess in the first and second lower semiconductor layers 220". In another embodiment, the first and second lower semiconductor layers 220" are not recessed, as is depicted.

With respect to FIG. 2G", in an embodiment, the lower semiconductor layer 220" of each of the epitaxial structures of the first and second source or drain structures have an atomic concentration of boron in the range of 1E20 atoms/$cm^3$-3E21 atoms/$cm^3$, and a germanium concentration in the range of 10% to 85%. In an embodiment, the capping semiconductor layer 225 has a germanium concentration greater than 60%. In an embodiment, the capping semiconductor layer 225 consists essentially of germanium.

With respect to FIG. 2G", in an embodiment, the resistivity of the first and second source or drain structures is in the range of 0.1 mOhm·cm to 0.3 mOhm·cm. In one such embodiment, the first and second source or drain structures induce a uniaxial compressive strain on the fin. In an embodiment, the lower semiconductor layer 220" of the first and second source or drain structures are adjacent an isolation structure 210. In one such embodiment, the lower semiconductor layer 220" of the first and second source or drain structures have a lower surface below an upper surface of the isolation structure 210.

Figure 3A:
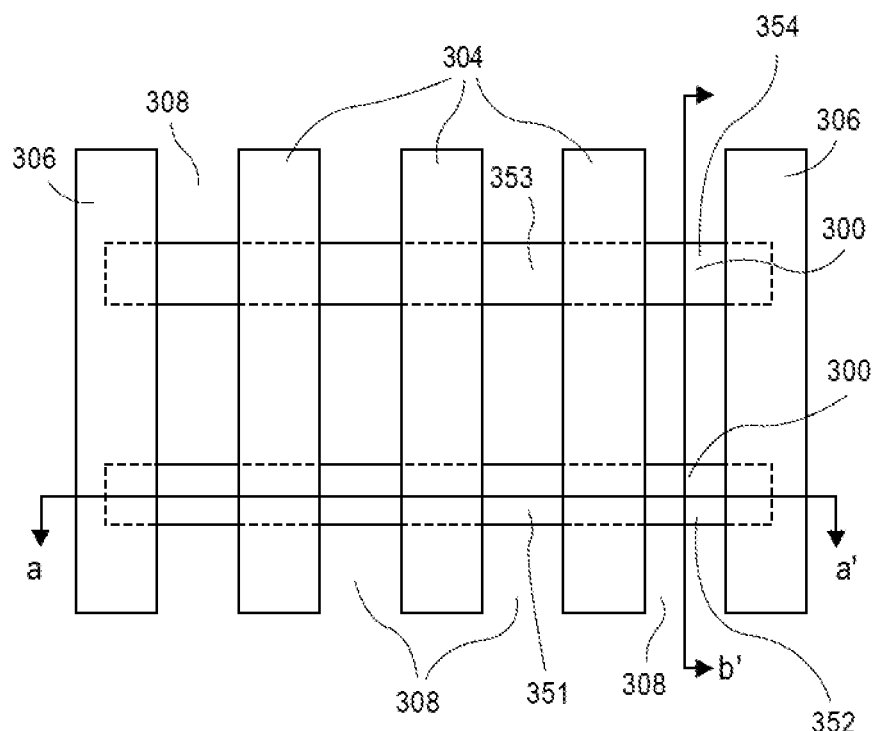
FIG. 3A illustrates a plan view of a plurality of gate lines over a pair of semiconductor fins, in accordance with another embodiment of the present disclosure.

In another aspect, FIG. 3A illustrates a plan view of a plurality of gate lines over a pair of semiconductor fins, in accordance with another embodiment of the present disclosure.

Referring to FIG. 3A, a plurality of active gate lines 304 is formed over a plurality of semiconductor fins 300. Dummy gate lines 306 are at the ends of the plurality of semiconductor fins 300. Spacings 308 between the gate lines 304/306 are locations where trench contacts may be located to provide conductive contacts to source or drain regions, such as source or drain regions 351, 352, 353, and 354. In an embodiment, the pattern of the plurality of gate lines 304/306 or the pattern of the plurality of semiconductor fins 300 is described as a grating structure. In one embodiment, the grating-like pattern includes the plurality of gate lines 304/306 and/or the pattern of the plurality of semiconductor fins 300 spaced at a constant pitch and having a constant width, or both.

Figure 3B:
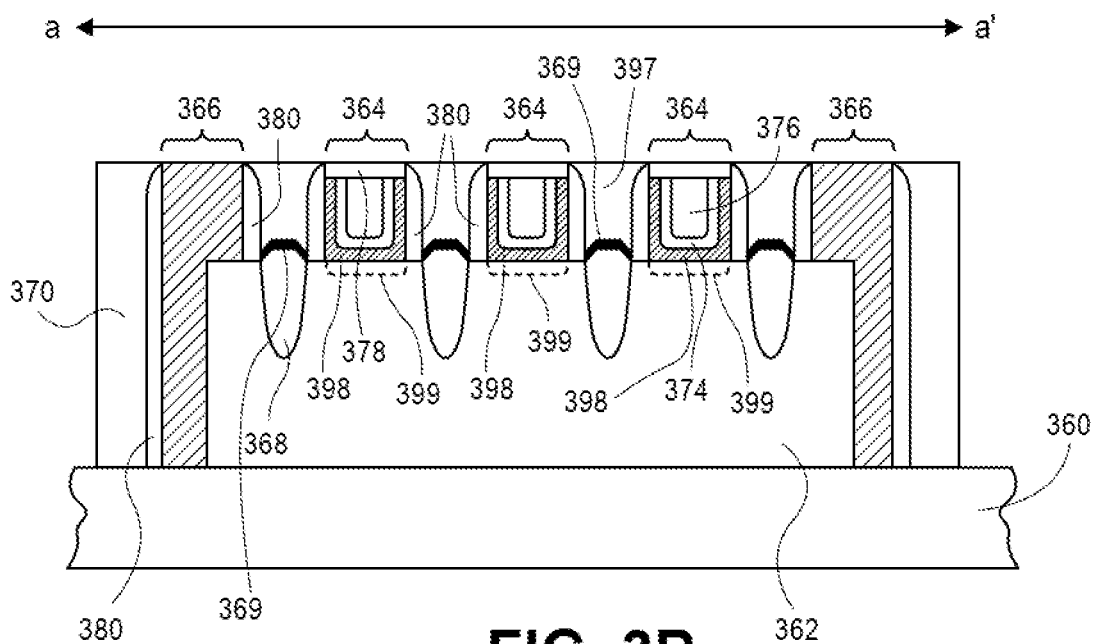
FIG. 3B illustrates a cross-sectional view, taken along the a-a' axis of FIG. 3A, in accordance with an embodiment of the present disclosure.

FIG. 3B illustrates a cross-sectional view, taken along the a-a' axis of FIG. 3A, in accordance with an embodiment of the present disclosure.

Referring to FIG. 3B, a plurality of active gate lines 364 is formed over a semiconductor fin 362 formed above a substrate 360. Dummy gate lines 366 are at the ends of the semiconductor fin 362. A dielectric layer 370 is outside of the dummy gate lines 366. A trench contact material 397 is between the active gate lines 364, and between the dummy gate lines 366 and the active gate lines 364. Embedded lower source or drain structures 368 and corresponding capping semiconductor layers 369 are in the semiconductor fin 362 between the active gate lines 364 and between the dummy gate lines 366 and the active gate lines 364. Embedded lower source or drain structures 368 and corresponding source or drain capping semiconductor layers 369 may be as described in association with the source or drain structures of FIG. 2G. Alternatively, source or drain structures such as described in association with FIGS. 2G' and 2G" may be used.

The active gate lines 364 include a gate dielectric structure 398/399, a workfunction gate electrode portion 374 and a fill gate electrode portion 376, and a dielectric capping layer 378. Dielectric spacers 380 line the sidewalls of the active gate lines 364 and the dummy gate lines 366.

In another aspect, trench contact structures, e.g., for source or drain regions, are described. In an example, FIG. 4 illustrates a cross-sectional view of an integrated circuit structure having trench contacts for a PMOS device, in accordance with another embodiment of the present disclosure.

Figure 4:
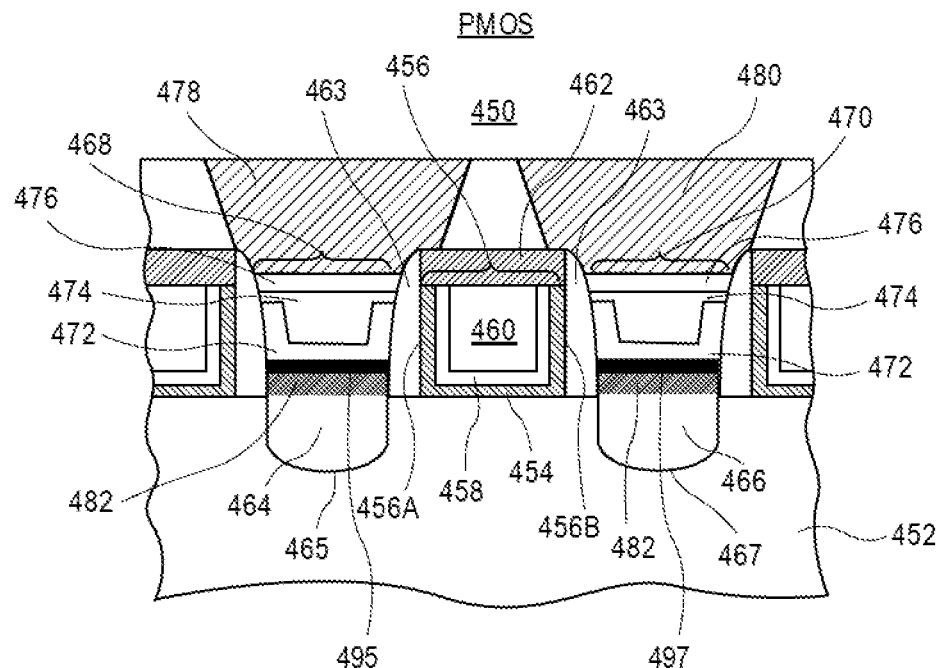
FIG. 4 illustrates a cross-sectional view of an integrated circuit structure having trench contacts for a PMOS device, in accordance with another embodiment of the present disclosure.

Referring to FIG. 4, an integrated circuit structure 450 includes a fin 452, such as a silicon germanium fin. A gate dielectric layer 454 is over fin 452. A gate electrode 456 is over the gate dielectric layer 454. In an embodiment, the gate electrode 456 includes a conformal conductive layer 458 and a conductive fill 460. In an embodiment, a dielectric cap 462 is over the gate electrode 456 and over the gate dielectric layer 454. The gate electrode has a first side 456A and a second side 456B opposite the first side 456A. Dielectric spacers are along the sidewalls of the gate electrode 456. In one embodiment, the gate dielectric layer 454 is further between a first of the dielectric spacers 463 and the first side 456A of the gate electrode 456, and between a second of the dielectric spacers 463 and the second side 456B of the gate electrode 456, as is depicted. In an embodiment, although not depicted, a thin oxide layer, such as a thermal or chemical silicon oxide or silicon dioxide layer, is between the fin 452 and the gate dielectric layer 454.

First 464 and second 466 semiconductor source or drain regions are adjacent the first 456A and second 456B sides of the gate electrode 456, respectively. In one embodiment, the first 464 and second 466 semiconductor source or drain regions include embedded epitaxial lower regions and a corresponding source or drain capping semiconductor layer 495 or 497, and are formed in recesses 465 and 467, respectively, of the fin 452, as is depicted. Embedded lower source or drain structures and corresponding capping semiconductor layers 495 or 497 may be as described in association with the source or drain structures of FIG. 2G. Alternatively, source or drain structures such as described in association with FIGS. 2G' and 2G" may be used.

First 468 and second 470 trench contact structures are over the first 464 and second 466 semiconductor source or drain regions adjacent the first 456A and second 456B sides of the gate electrode 456, respectively. The first 468 and second 470 trench contact structures both include a U-shaped metal layer 472 and a T-shaped metal layer 474 on and over the entirety of the U-shaped metal layer 472. In one embodiment, the U-shaped metal layer 472 and the T-shaped metal layer 474 differ in composition. In one such embodiment, the U-shaped metal layer 472 includes titanium, and the T-shaped metal layer 474 includes cobalt. In one embodiment, the first 468 and second 470 trench contact structures both further include a third metal layer 476 on the T-shaped metal layer 474. In one such embodiment, the third metal layer 476 and the U-shaped metal layer 472 have a same composition. In a particular embodiment, the third metal layer 476 and the U-shaped metal layer 472 include titanium, and the T-shaped metal layer 474 includes cobalt.

A first trench contact via 478 is electrically connected to the first trench contact 468. In a particular embodiment, the first trench contact via 478 is on and coupled to the third metal layer 476 of the first trench contact 468. The first trench contact via 478 is further over and in contact with a portion of one of the dielectric spacers 463, and over and in contact with a portion of the dielectric cap 462. A second trench contact via 480 is electrically connected to the second trench contact 470. In a particular embodiment, the second trench contact via 480 is on and coupled to the third metal layer 476 of the second trench contact 470. The second trench contact via 480 is further over and in contact with a portion of another of the dielectric spacers 463, and over and in contact with another portion of the dielectric cap 462.

In an embodiment, a metal silicide layer 482 is directly between the first 468 and second 470 trench contact structures and the first 464 and second 466 semiconductor source or drain regions, respectively. In an embodiment, the first 464 and second 466 semiconductor source or drain regions are first and second P-type semiconductor source or drain regions.

One or more embodiments described herein are directed to the use of metal chemical vapor deposition for wrap-around semiconductor contacts. Embodiments may be applicable to or include one or more of chemical vapor deposition (CVD), plasma enhanced chemical vapor deposition (PECVD), atomic layer deposition (ALD), conductive contact fabrication, or thin films. Particular embodiments may include the fabrication of a titanium or like metallic layer using a low temperature (e.g., less than 500 degrees Celsius, or in the range of 400-500 degrees Celsius) chemical vapor deposition of a contact metal to provide a conformal source or drain contact. Implementation of such a conformal source or drain contact may improve three-dimensional (3D) transistor complementary metal oxide semiconductor (CMOS) performance.

To provide context, metal to semiconductor contact layers may be deposited using sputtering. Sputtering is a line of sight process and may not be well suited to 3D transistor fabrication. Known sputtering solutions have poor or incomplete metal-semiconductor junctions on device contact surfaces with an angle to the incidence of deposition. In accordance with one or more embodiments of the present disclosure, a low temperature chemical vapor deposition process is implemented for fabrication of a contact metal to provide conformality in three dimensions and maximize the metal semiconductor junction contact area. The resulting greater contact area may reduce the resistance of the junction. Embodiments may include deposition on semiconductor surfaces having a non-flat topography, where the topography of an area refers to the surface shapes and features themselves, and a non-flat topography includes surface shapes and features or portions of surface shapes and features that are non-flat, i.e., surface shapes and features that are not entirely flat. In an embodiment, deposition is on a semiconductor surface of a source or drain structure having a relatively high germanium content.

Embodiments described herein may include fabrication of wrap-around contact structures. In one such embodiment, the use of pure metal conformally deposited onto transistor source-drain contacts by chemical vapor deposition, plasma enhanced chemical vapor deposition, atomic layer deposition, or plasma enhanced atomic layer deposition is described. Such conformal deposition may be used to increase the available area of metal semiconductor contact and reduce resistance, improving the performance of the transistor device. In an embodiment, the relatively low temperature of the deposition leads to a minimized resistance of the junction per unit area.

It is to be appreciated that a variety of integrated circuit structures may be fabricated using an integration scheme involving a metallic layer deposition process as described herein. In accordance with an embodiment of the present disclosure, a method of fabricating an integrated circuit structure includes providing a substrate in a chemical vapor deposition (CVD) chamber having an RF source, the substrate having a feature thereon. The method also includes reacting titanium tetrachloride ($TiCl_4$) and hydrogen ($H_2$) to form a titanium (Ti) layer on the feature of the substrate. In an embodiment, the titanium layer has a total atomic composition including 98% or greater of titanium and 0.5-2% of chlorine. In alternative embodiments, a similar process is used to fabricate a high purity metallic layer of zirconium (Zr), hafnium (Hf), tantalum (Ta), niobium (Nb), or vanadium (V).

In accordance with an embodiment of the present disclosure, the feature of the substrate is a source or drain contact trench exposing a semiconductor source or drain structure. The titanium layer (or other high purity metallic layer) is a conductive contact layer for the semiconductor source or drain structure. Exemplary embodiments of such an implementation are described below in association with FIG. 5.

Figure 5:
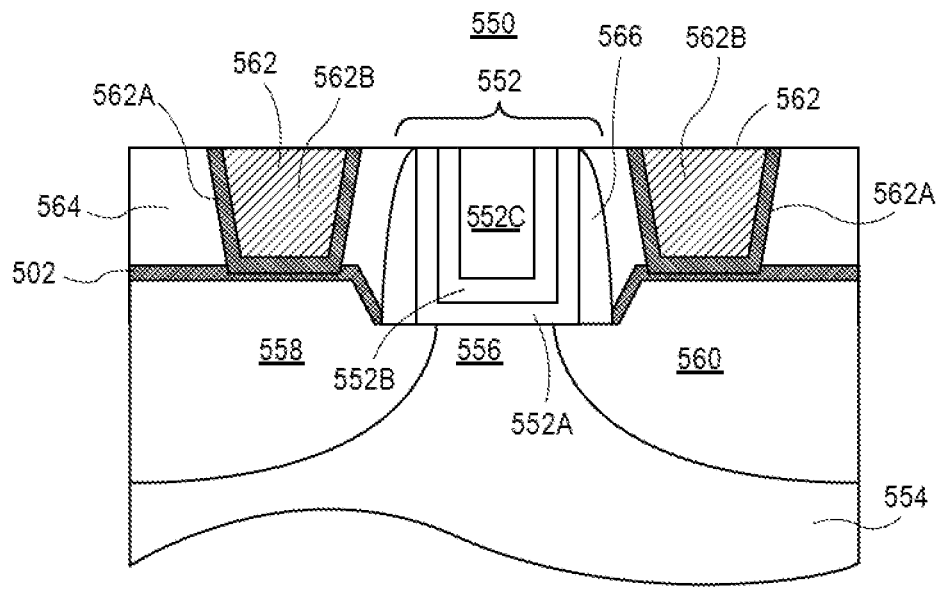
FIG. 5 illustrates a cross-sectional view of an integrated circuit structure having a conductive contact on a raised source or drain region, in accordance with an embodiment of the present disclosure.

FIG. 5 illustrates a cross-sectional view of an integrated circuit structure having a conductive contact on a raised source or drain region, in accordance with an embodiment of the present disclosure.

Referring to FIG. 5, a semiconductor structure 550 includes a gate structure 552 above a substrate 554. The gate structure 552 includes a gate dielectric layer 552A, a workfunction layer 552B, and a gate fill 552C. A source region 558 and a drain region 560 are on opposite sides of the gate structure 552. Source or drain contacts 562 are electrically connected to the source region 558 and the drain region 560, and are spaced apart of the gate structure 552 by one or both of an inter-layer dielectric layer 564 or gate dielectric spacers 566. The source region 558 and the drain region 560 include epitaxial or embedded lower material regions formed in etched-out regions of the substrate 554, and corresponding source or drain capping semiconductor layers 502. Embedded lower source or drain structures and corresponding capping semiconductor layers 502 may be as described in association with the source or drain structures of FIG. 2G. Alternatively, source or drain structures such as described in association with FIGS. 2G' and 2G" may be used.

In an embodiment, the source or drain contacts 562 include a high purity metallic layer 562A, such as described above, and a conductive trench fill material 562B. In one embodiment, the high purity metallic layer 562A has a total atomic composition including 98% or greater of titanium. In one such embodiment, the total atomic composition of the high purity metallic layer 562A further includes 0.5-2% of chlorine. In an embodiment, the high purity metallic layer 562A has a thickness variation of 30% or less. In an embodiment, the conductive trench fill material 562B is composed of a conductive material such as, but not limited to, Cu, Al, W, Co, or alloys thereof.

In another aspect, contact over active gate (COAG) structures and processes are described. One or more embodiments of the present disclosure are directed to semiconductor structures or devices having one or more gate contact structures (e.g., as gate contact vias) disposed over active portions of gate electrodes of the semiconductor structures or devices. One or more embodiments of the present disclosure are directed to methods of fabricating semiconductor structures or devices having one or more gate contact structures formed over active portions of gate electrodes of the semiconductor structures or devices. Approaches described herein may be used to reduce a standard cell area by enabling gate contact formation over active gate regions. In one or more embodiments, the gate contact structures fabricated to contact the gate electrodes are self-aligned via structures.

In an embodiment, an integrated circuit structure, semiconductor structure or device is a non-planar device such as, but not limited to, a fin-FET or a tri-gate device. In such an embodiment, a corresponding semiconducting channel region is composed of or is formed in a three-dimensional body. In one such embodiment, gate electrode stacks of gate lines surround at least a top surface and a pair of sidewalls of the three-dimensional body. In another embodiment, at least the channel region is made to be a discrete three-dimensional body, such as in a gate-all-around device. In one such embodiment, each gate electrode stack of a plurality of gate lines completely surrounds the channel region.

More generally, one or more embodiments are directed to approaches for, and structures formed from, landing a gate contact via directly on an active transistor gate. Such approaches may eliminate the need for extension of a gate line on isolation for contact purposes. Such approaches may also eliminate the need for a separate gate contact (GCN) layer to conduct signals from a gate line or structure. In an embodiment, eliminating the above features is achieved by recessing contact metals in a trench contact (TCN) and introducing an additional dielectric material in the process flow (e.g., TILA). The additional dielectric material is included as a trench contact dielectric cap layer with etch characteristics different from the gate dielectric material cap layer already used for trench contact alignment in a gate aligned contact process (GAP) processing scheme (e.g., GILA).

In an embodiment, providing an integrated circuit structure involves formation of a contact pattern which is essentially perfectly aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, gate stack structures may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including $SF_6$. In another embodiment, dummy gates are composed of polycrystalline silicon or amorphous silicon and are removed with a wet etch process including aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at an integrated circuit structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

It is to be appreciated that differing structural relationships between an insulating gate cap layer and an insulating trench contact cap layer may be fabricated. As examples, FIGS. 6A and 6B illustrate cross-sectional views of various integrated circuit structures, each having trench contacts including an overlying insulating cap layer and having gate stacks including an overlying insulating cap layer, in accordance with an embodiment of the present disclosure.

Figure 6A:
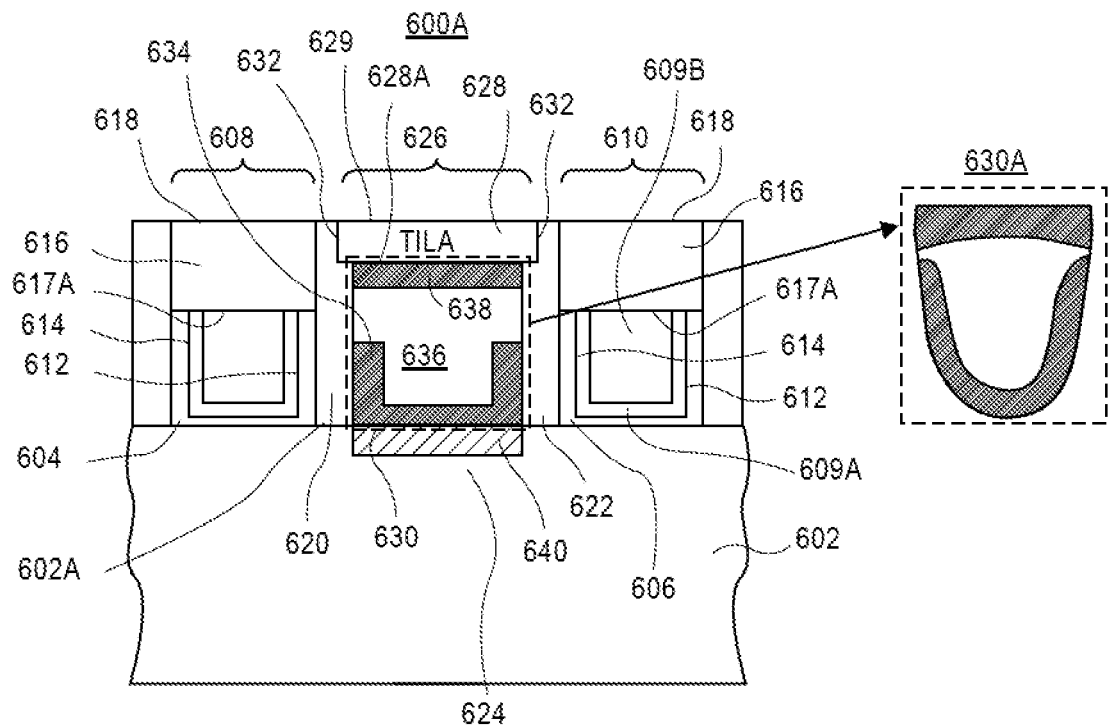
FIGS. 6A and 6B illustrate cross-sectional views of various integrated circuit structures, each having trench contacts including an overlying insulating cap layer and having gate stacks including an overlying insulating cap layer, in accordance with an embodiment of the present disclosure.
Figure 6B:
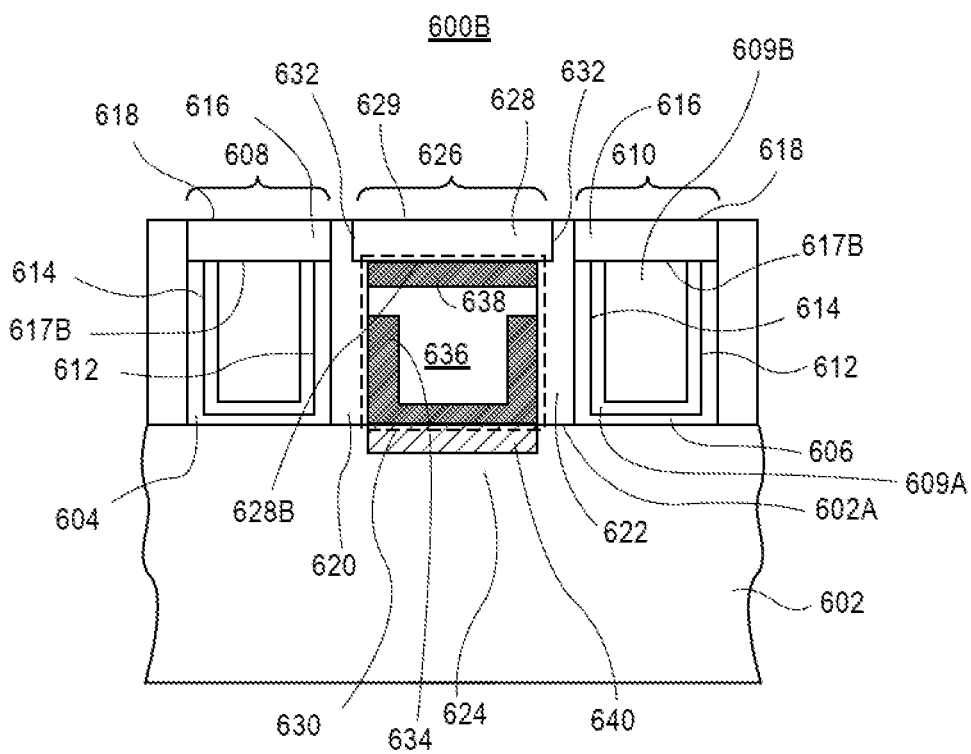

Referring to FIGS. 6A and 6B, integrated circuit structures 600A and 600B, respectively, include a fin 602, such as a silicon germanium fin. Although depicted as a cross-sectional view, it is to be appreciated that the fin 602 has a top 602A and sidewalls (into and out of the page of the perspective shown). First 604 and second 606 gate dielectric layers are over the top 602A of the fin 602 and laterally adjacent the sidewalls of the fin 602. First 608 and second 610 gate electrodes are over the first 604 and second 606 gate dielectric layers, respectively, over the top 602A of the fin 602 and laterally adjacent the sidewalls of the fin 602. The first 608 and second 610 gate electrodes each include a conformal conductive layer 609A, such as a workfunction-setting layer, and a conductive fill material 609B above the conformal conductive layer 609A. The first 608 and second 610 gate electrodes both have a first side 612 and a second side 614 opposite the first side 612. The first 608 and second 610 gate electrodes also both have an insulating cap 616 having a top surface 618.

A first dielectric spacer 620 is adjacent the first side 612 of the first gate electrode 608. A second dielectric spacer 622 is adjacent the second side 614 of the second gate electrode 610. A semiconductor source or drain region 624 is adjacent the first 620 and second 622 dielectric spacers. A trench contact structure 626 is over the semiconductor source or drain region 624 adjacent the first 620 and second 622 dielectric spacers. In an embodiment, the semiconductor source or drain region 624 has a structure such as described above in association with FIGS. 2G, 2G', 2G", and other embodiments described herein.

The trench contact structure 626 includes an insulating cap 628 on a conductive structure 630. The insulating cap 628 of the trench contact structure 626 has a top surface 629 substantially co-planar with a top surfaces 618 of the insulating caps 616 of the first 608 and second 610 gate electrodes. In an embodiment, the insulating cap 628 of the trench contact structure 626 extends laterally into recesses 632 in the first 620 and second 622 dielectric spacers. In such an embodiment, the insulating cap 628 of the trench contact structure 626 overhangs the conductive structure 630 of the trench contact structure 626. In other embodiments, however, the insulating cap 628 of the trench contact structure 626 does not extend laterally into recesses 632 in the first 620 and second 622 dielectric spacers and, hence, does not overhang the conductive structure 630 of the trench contact structure 626.

It is to be appreciated that the conductive structure 630 of the trench contact structure 626 may not be rectangular, as depicted in FIGS. 6A and 6B. For example, the conductive structure 630 of the trench contact structure 626 may have a cross-sectional geometry similar to or the same as the geometry shown for conductive structure 630A illustrated in the projection of FIG. 6A.

In an embodiment, the insulating cap 628 of the trench contact structure 626 has a composition different than a composition of the insulating caps 616 of the first 608 and second 610 gate electrodes. In one such embodiment, the insulating cap 628 of the trench contact structure 626 includes a carbide material, such as a silicon carbide material. The insulating caps 616 of the first 608 and second 610 gate electrodes include a nitride material, such as a silicon nitride material.

In an embodiment, the insulating caps 616 of the first 608 and second 610 gate electrodes both have a bottom surface 617A below a bottom surface 628A of the insulating cap 628 of the trench contact structure 626, as is depicted in FIG. 6A. In another embodiment, the insulating caps 616 of the first 608 and second 610 gate electrodes both have a bottom surface 617B substantially co-planar with a bottom surface 628B of the insulating cap 628 of the trench contact structure 626, as is depicted in FIG. 6B. In another embodiment, although not depicted, the insulating caps 616 of the first 608 and second 610 gate electrodes both have a bottom surface above a bottom surface of an insulating cap 628 of a trench contact structure 626.

In an embodiment, the conductive structure 630 of the trench contact structure 626 includes a U-shaped metal layer 634, a T-shaped metal layer 636 on and over the entirety of the U-shaped metal layer 634, and a third metal layer 638 on the T-shaped metal layer 636. The insulating cap 628 of the trench contact structure 626 is on the third metal layer 638. In one such embodiment, the third metal layer 638 and the U-shaped metal layer 634 include titanium, and the T-shaped metal layer 636 includes cobalt. In a particular such embodiment, the T-shaped metal layer 636 further includes carbon.

In an embodiment, a metal silicide layer 640 is directly between the conductive structure 630 of the trench contact structure 626 and the semiconductor source or drain region 624. In one such embodiment, the metal silicide layer 640 includes titanium and silicon. In a particular such embodiment, the semiconductor source or drain region 624 is a P-type semiconductor source or drain region.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic or boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, a FIN-FET, a nanowire device, or a nanoribbon device. One or more embodiments may be particularly useful for fabricating semiconductor devices at a 10 nanometer (10 nm) technology node sub-10 nanometer (10 nm) technology node.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

It is to be appreciated that in the above exemplary FEOL embodiments, in an embodiment, 10 nanometer or sub-10 nanometer node processing is implemented directly in to the fabrication schemes and resulting structures as a technology driver. In other embodiment, FEOL considerations may be driven by BEOL 10 nanometer or sub-10 nanometer processing requirements. For example, material selection and layouts for FEOL layers and devices may need to accommodate BEOL processing. In one such embodiment, material selection and gate stack architectures are selected to accommodate high density metallization of the BEOL layers, e.g., to reduce fringe capacitance in transistor structures formed in the FEOL layers but coupled together by high density metallization of the BEOL layers.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
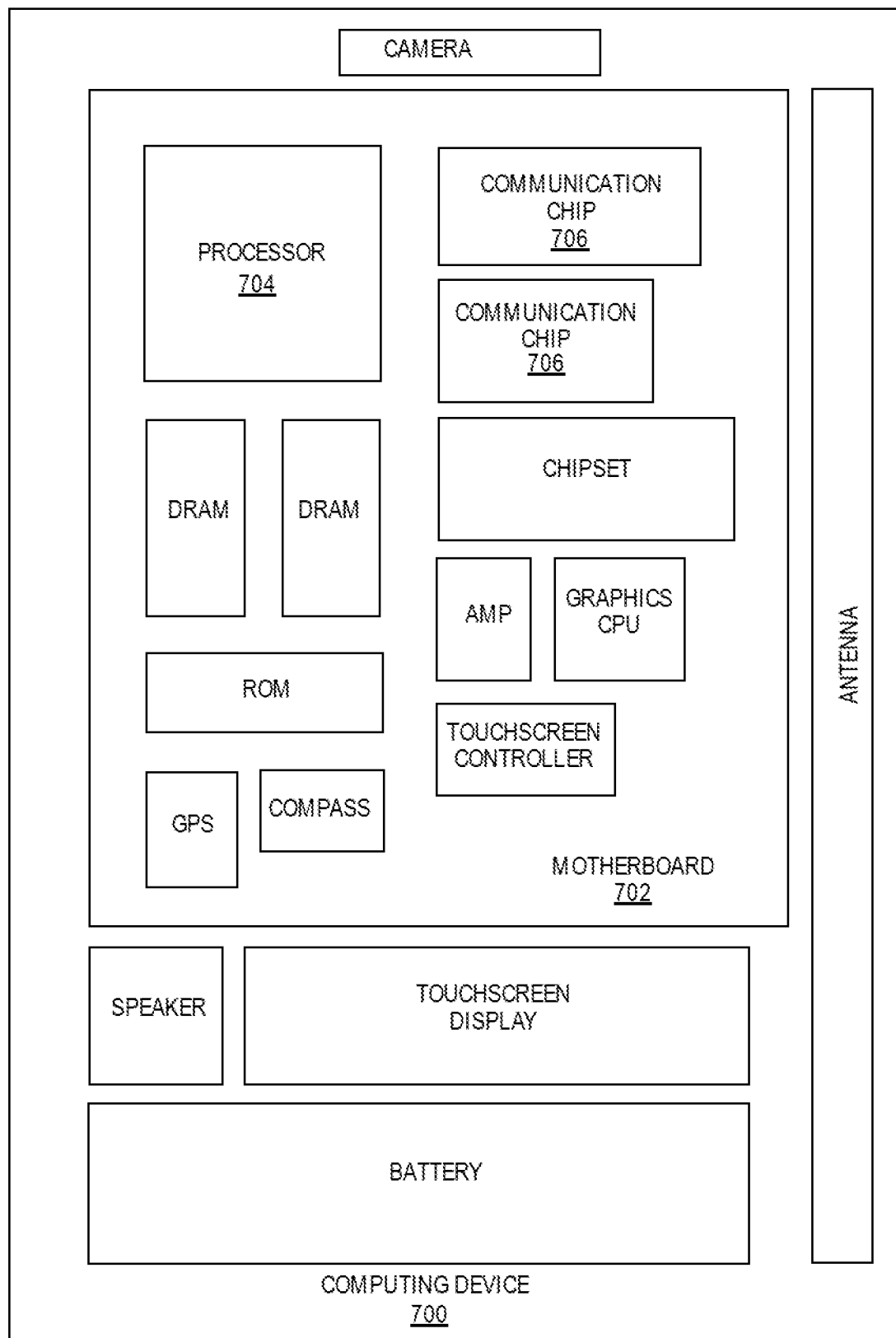
FIG. 7 illustrates a computing device in accordance with one implementation of the disclosure.

FIG. 7 illustrates a computing device 700 in accordance with one implementation of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 706 also includes an integrated circuit die packaged within the communication chip 706. In accordance with another implementation of the disclosure, the integrated circuit die of the communication chip is built in accordance with implementations of the disclosure.

In further implementations, another component housed within the computing device 700 may contain an integrated circuit die built in accordance with implementations of embodiments of the disclosure.

In various embodiments, the computing device 700 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
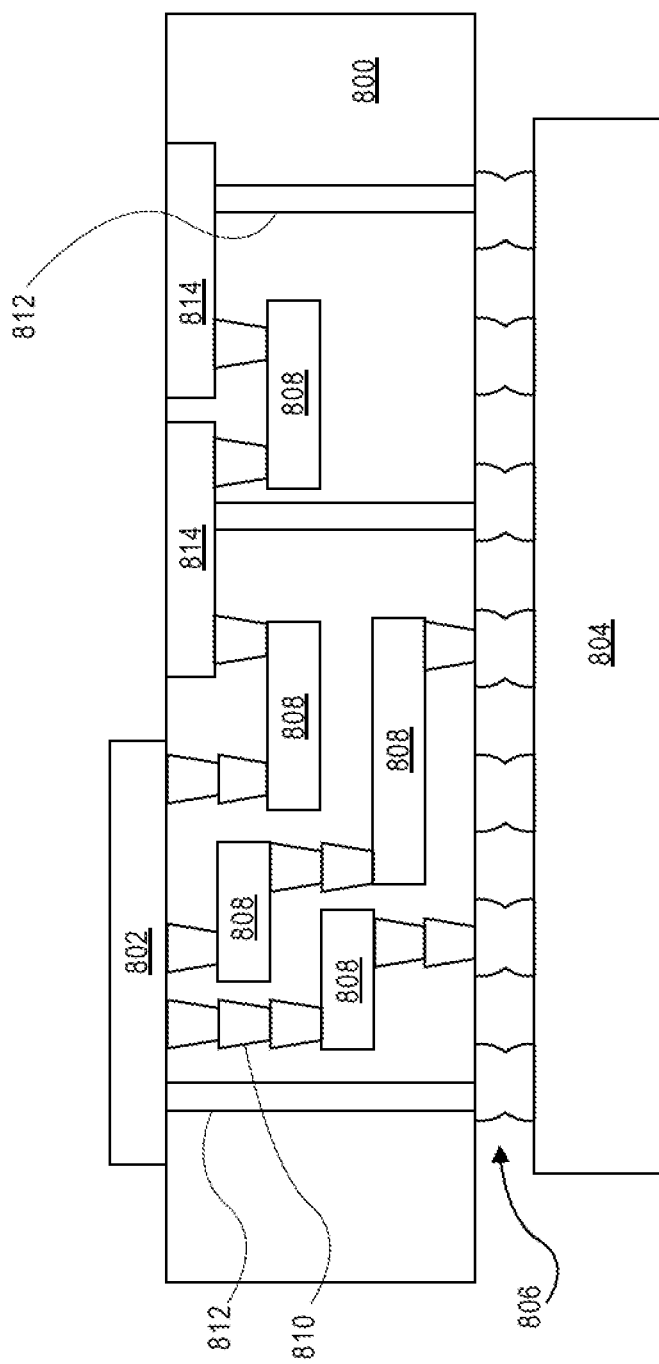
FIG. 8 illustrates an interposer that includes one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And, in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer 800 may be formed of alternate rigid or flexible materials that may include the same materials described above for use in a semiconductor substrate, such as silicon, germanium, and other group III-V and group IV materials.

The interposer 800 may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800 or in the fabrication of components included in the interposer 800.

Figure 9:
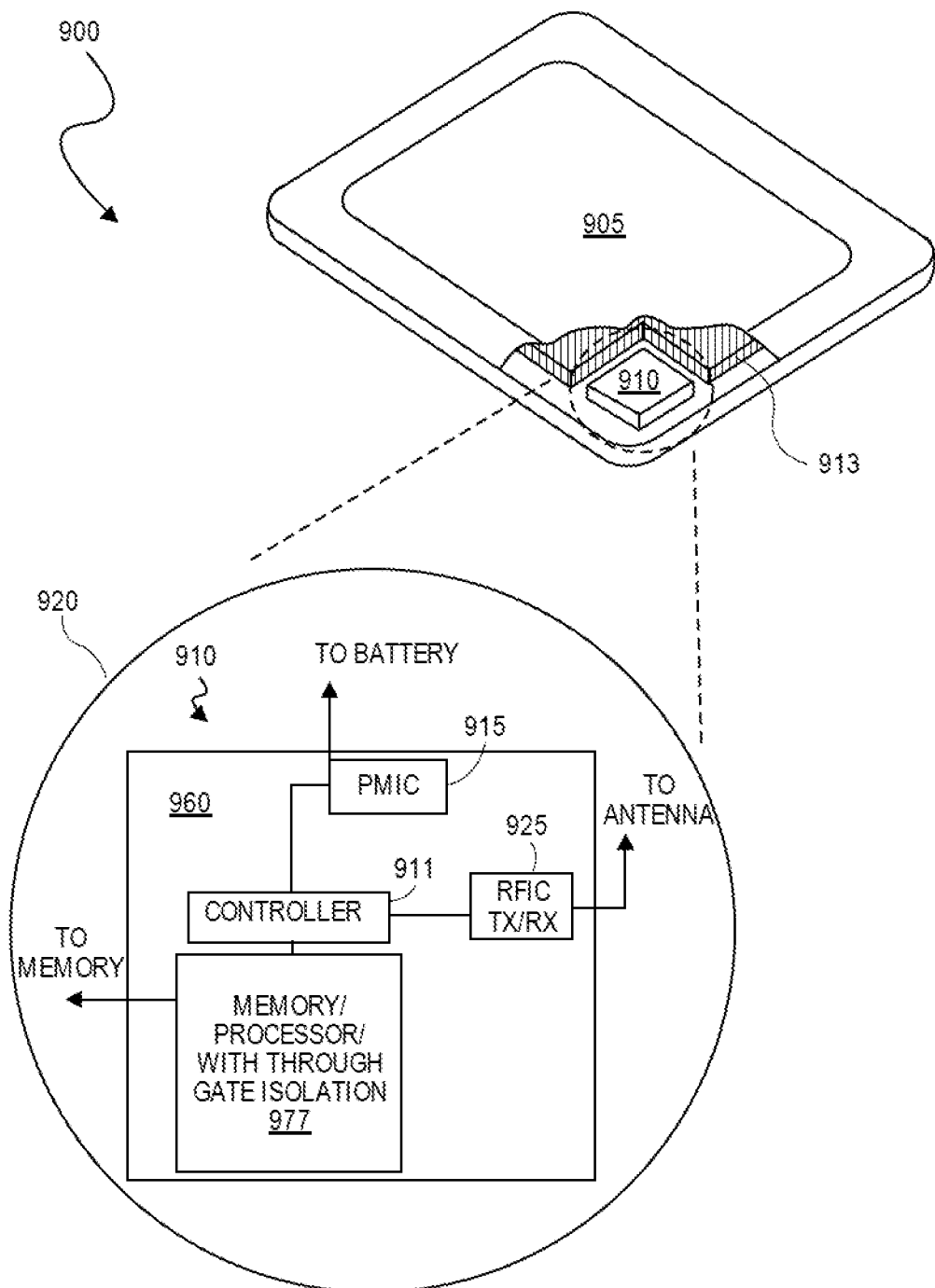
FIG. 9 is an isometric view of a mobile computing platform employing an IC fabricated according to one or more processes described herein or including one or more features described herein, in accordance with an embodiment of the present disclosure.

FIG. 9 is an isometric view of a mobile computing platform 900 employing an integrated circuit (IC) fabricated according to one or more processes described herein or including one or more features described herein, in accordance with an embodiment of the present disclosure.

The mobile computing platform 900 may be any portable device configured for each of electronic data display, electronic data processing, and wireless electronic data transmission. For example, mobile computing platform 900 may be any of a tablet, a smart phone, laptop computer, etc. and includes a display screen 905 which in the exemplary embodiment is a touchscreen (capacitive, inductive, resistive, etc.), a chip-level (SoC) or package-level integrated system 910, and a battery 913. As illustrated, the greater the level of integration in the system 910 enabled by higher transistor packing density, the greater the portion of the mobile computing platform 900 that may be occupied by the battery 913 or non-volatile storage, such as a solid state drive, or the greater the transistor gate count for improved platform functionality. Similarly, the greater the carrier mobility of each transistor in the system 910, the greater the functionality. As such, techniques described herein may enable performance and form factor improvements in the mobile computing platform 900.

The integrated system 910 is further illustrated in the expanded view 920. In the exemplary embodiment, packaged device 977 includes at least one memory chip (e.g., RAM), or at least one processor chip (e.g., a multi-core microprocessor and/or graphics processor) fabricated according to one or more processes described herein or including one or more features described herein. The packaged device 977 is further coupled to the board 960 along with one or more of a power management integrated circuit (PMIC) 915, RF (wireless) integrated circuit (RFIC) 925 including a wideband RF (wireless) transmitter and/or receiver (e.g., including a digital baseband and an analog front end module further includes a power amplifier on a transmit path and a low noise amplifier on a receive path), and a controller thereof 911. Functionally, the PMIC 915 performs battery power regulation, DC-to-DC conversion, etc., and so has an input coupled to the battery 913 and with an output providing a current supply to all the other functional modules. As further illustrated, in the exemplary embodiment, the RFIC 925 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 977 or within a single IC (SoC) coupled to the package substrate of the packaged device 977.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 10:
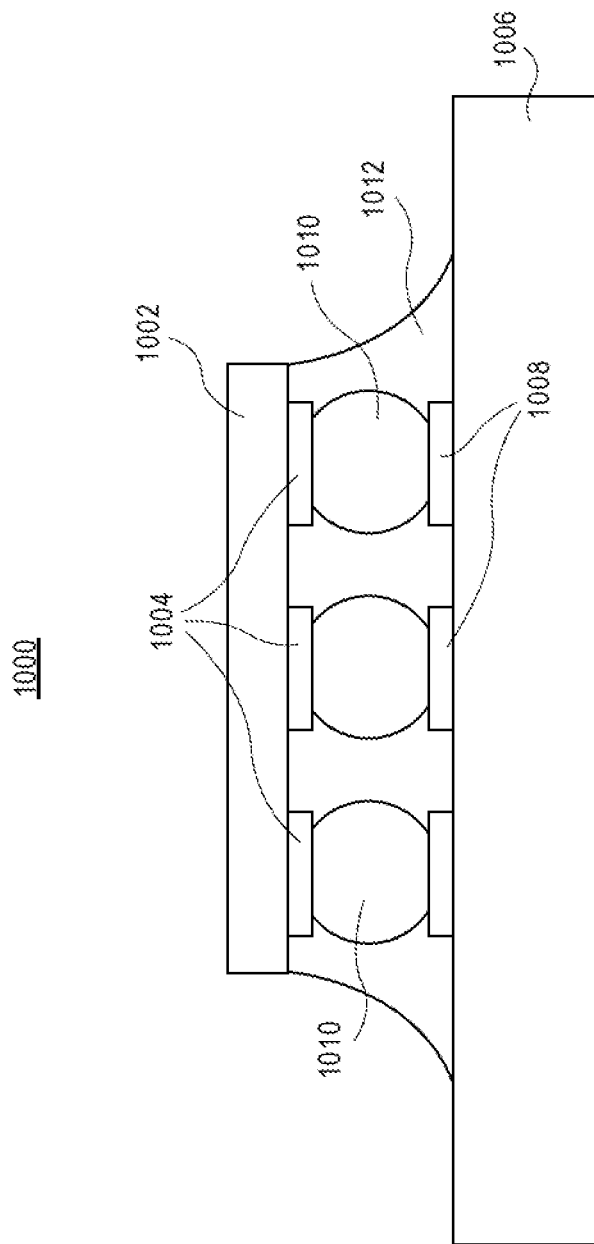
FIG. 10 illustrates a cross-sectional view of a flip-chip mounted die, in accordance with an embodiment of the present disclosure.

FIG. 10 illustrates a cross-sectional view of a flip-chip mounted die, in accordance with an embodiment of the present disclosure.

Referring to FIG. 10, an apparatus 1000 includes a die 1002 such as an integrated circuit (IC) fabricated according to one or more processes described herein or including one or more features described herein, in accordance with an embodiment of the present disclosure. The die 1002 includes metallized pads 1004 thereon. A package substrate 1006, such as a ceramic or organic substrate, includes connections 1008 thereon. The die 1002 and package substrate 1006 are electrically connected by solder balls 1010 coupled to the metallized pads 1004 and the connections 1008. An underfill material 1012 surrounds the solder balls 1010.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include integrated circuit structures having source or drain structures with low resistivity, and methods of fabricating integrated circuit structures having source or drain structures with low resistivity, are described.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a fin having a lower fin portion and an upper fin portion. A gate stack is over the upper fin portion of the fin, the gate stack having a first side opposite a second side. A first source or drain structure includes an epitaxial structure embedded in the fin at the first side of the gate stack. A second source or drain structure includes an epitaxial structure embedded in the fin at the second side of the gate stack.

Each epitaxial structure of the first and second source or drain structures include silicon, germanium and boron, with an atomic concentration of boron in the range of 1E20 atoms/cm$^3$-3E21 atoms/cm$^3$, and a germanium concentration in the range of 10% to 85%, and the first and second source or drain structures having a resistivity less than or equal to 0.3 mOhm·cm.

Example embodiment 2: The integrated circuit structure of example embodiment 1, wherein the resistivity of the first and second source or drain structures is in the range of 0.1 mOhm·cm to 0.3 mOhm·cm.

Example embodiment 3: The integrated circuit structure of example embodiment 1 or 2, wherein the first and second source or drain structures induce a uniaxial compressive strain on the fin.

Example embodiment 4: The integrated circuit structure of example embodiment 1, 2 or 3, wherein the first and second source or drain structures are adjacent an isolation structure.

Example embodiment 5: The integrated circuit structure of example embodiment 4, wherein the first and second source or drain structures have a lower surface below an upper surface of the isolation structure.

Example embodiment 6: The integrated circuit structure of example embodiment 1, 2, 3, 4 or 5, wherein the lower fin portion includes a portion of an underlying bulk single crystalline silicon substrate.

Example embodiment 7: The integrated circuit structure of example embodiment 1, 2, 3, 4, 5 or 6, further including first and second dielectric gate sidewall spacers along the first and second sides of the gate stack, respectively.

Example embodiment 8: The integrated circuit structure of example embodiment 1, 2, 3, 4, 5, 6 or 7, further including a first conductive contact on the epitaxial structure of the first source or drain structure, and a second conductive contact on the epitaxial structure of the second source or drain structure.

Example embodiment 9: The integrated circuit structure of example embodiment 8, wherein the first and second conductive contacts are in a partial recess in the epitaxial structures of the first and second source or drain structures, respectively.

Example embodiment 10: An integrated circuit structure includes a fin having a lower fin portion and an upper fin portion. A gate stack is over the upper fin portion of the fin, the gate stack having a first side opposite a second side. A first source or drain structure includes an epitaxial structure embedded in the fin at the first side of the gate stack, the epitaxial structure having a lower semiconductor layer and a capping semiconductor layer. A second source or drain structure includes an epitaxial structure embedded in the fin at the second side of the gate stack, the epitaxial structure having a lower semiconductor layer and a capping semiconductor layer. The lower semiconductor layer of each of the epitaxial structures of the first and second source or drain structures include silicon, germanium and boron. The capping semiconductor layer of the epitaxial structure of each of the first and second source or drain structures has a germanium concentration greater than the lower semiconductor layer. The first and second source or drain structures have a resistivity less than or equal to 0.3 mOhm·cm.

Example embodiment 11: The integrated circuit structure of example embodiment 10, wherein the lower semiconductor layer of each of the epitaxial structures of the first and second source or drain structures have an atomic concentration of boron in the range of 1E20 atoms/cm$^3$-3E21 atoms/cm$^3$, and a germanium concentration in the range of 10% to 85%.

Example embodiment 12: The integrated circuit structure of example embodiment 10 or 11, wherein the resistivity of the first and second source or drain structures is in the range of 0.1 mOhm·cm to 0.3 mOhm·cm.

Example embodiment 13: The integrated circuit structure of example embodiment 10, 11 or 12, wherein the first and second source or drain structures induce a uniaxial compressive strain on the fin.

Example embodiment 14: The integrated circuit structure of example embodiment 10, 11, 12 or 13, wherein the capping semiconductor layer consists essentially of germanium.

Example embodiment 15: The integrated circuit structure of example embodiment 10, 11, 12, 13 or 14, wherein the lower fin portion includes a portion of an underlying bulk single crystalline silicon substrate.

Example embodiment 16: The integrated circuit structure of example embodiment 10, 11, 12, 13, 14 or 15, further including first and second dielectric gate sidewall spacers along the first and second sides of the gate stack, respectively.

Example embodiment 17: The integrated circuit structure of example embodiment 10, 11, 12, 13, 14, 15 or 16, further including a first conductive contact on the capping semiconductor layer of the first source or drain structure; and a second conductive contact on the capping semiconductor layer of the second source or drain structure.

Example embodiment 18: The integrated circuit structure of example embodiment 17, wherein the first and second conductive contacts are in a partial recess in the capping semiconductor layers of the first and second source or drain structures, respectively.

Example embodiment 19: An integrated circuit structure includes a fin having a lower fin portion and an upper fin portion. A gate stack is over the upper fin portion of the fin, the gate stack having a first side opposite a second side. A first source or drain structure includes an epitaxial structure embedded in the fin at the first side of the gate stack, the epitaxial structure having a lower semiconductor layer and a capping semiconductor layer. A second source or drain structure includes an epitaxial structure embedded in the fin at the second side of the gate stack, the epitaxial structure having a lower semiconductor layer and a capping semiconductor layer. The lower semiconductor layer of each of the epitaxial structures of the first and second source or drain structures include silicon, germanium and boron. The capping semiconductor layer of the epitaxial structure of each of the first and second source or drain structures has a germanium concentration greater than the lower semiconductor layer. The first and second source or drain structures have a resistivity less than or equal to 0.3 mOhm·cm. A first conductive contact is on the capping semiconductor layer of the first source or drain structure. A second conductive contact is on the capping semiconductor layer of the second source or drain structure. A first dielectric spacer is along sidewalls of the first conductive contact, and the capping semiconductor layer of the first source or drain structure is confined between the first dielectric spacer. A second dielectric spacer is along sidewalls of the second conductive contact, and the capping semiconductor layer of the second source or drain structure is confined between the second dielectric spacer.

Example embodiment 20: The integrated circuit structure of example embodiment 19, further including first and second dielectric gate sidewall spacers along the first and second sides of the gate stack, respectively.

Example embodiment 21: The integrated circuit structure of example embodiment 19 or 20, wherein the lower semiconductor layer of each of the epitaxial structures of the first and second source or drain structures have an atomic concentration of boron in the range of 1E20 atoms/cm$^3$-3E21 atoms/cm$^3$, and a germanium concentration in the range of 10% to 85%.

Example embodiment 22: The integrated circuit structure of example embodiment 19, 20 or 21, wherein the resistivity of the first and second source or drain structures is in the range of 0.1 mOhm·cm to 0.3 mOhm·cm.

Example embodiment 23: The integrated circuit structure of example embodiment 19, 20, 21 or 22, wherein the first and second source or drain structures induce a uniaxial compressive strain on the fin.

Example embodiment 24: The integrated circuit structure of example embodiment 19, 20, 21, 22 or 23, wherein the capping semiconductor layer consists essentially of germanium.

Example embodiment 25: The integrated circuit structure of example embodiment 19, 20, 21, 22, 23 or 24, wherein the lower fin portion includes a portion of an underlying bulk single crystalline silicon substrate.

What is claimed is:

1. An integrated circuit structure, comprising:
   a nanowire;
   a gate stack having a gate electrode, the gate electrode completely surrounding a channel region of the nanowire, the gate stack having a first side opposite a second side;
   a first source or drain structure comprising an epitaxial structure at the first side of the gate stack;
   a second source or drain structure comprising an epitaxial structure at the second side of the gate stack, each epitaxial structure of the first and second source or drain structures in direct physical contact with the nanowire and comprising silicon, germanium and boron throughout an entirety of the epitaxial structure, with an atomic concentration of boron in the range of 1E20 atoms/cm$^3$-3E21 atoms/cm$^3$, and a germanium concentration in the range of 10% to 85%; and
   an isolation structure laterally adjacent to one of the first source or drain structure or the second source or drain structure, wherein the one of the first source or drain structure or the second source or drain structure vertically overlaps the isolation structure.

2. The integrated circuit structure of claim 1, wherein the first and second source or drain structures have a resistivity less than or equal to 0.3 mOhm·cm.

3. The integrated circuit structure of claim 2, wherein the resistivity of the first and second source or drain structures is in the range of 0.1 mOhm·cm to 0.3 mOhm·cm.

4. The integrated circuit structure of claim 1, further comprising:
   first and second dielectric gate sidewall spacers along the first and second sides of the gate stack, respectively.

5. The integrated circuit structure of claim 1, further comprising:
   a first conductive contact on the epitaxial structure of the first source or drain structure; and
   a second conductive contact on the epitaxial structure of the second source or drain structure.

6. The integrated circuit structure of claim 5, wherein the first and second conductive contacts are in a partial recess in the epitaxial structures of the first and second source or drain structures, respectively.

7. An integrated circuit structure, comprising:
   a nanowire;
   a gate stack having a gate electrode, the gate electrode completely surrounding a channel region of the nanowire, the gate stack having a first side opposite a second side;
   a first source or drain structure comprising an epitaxial structure at the first side of the gate stack, the epitaxial structure comprising a lower semiconductor layer and a capping semiconductor layer;
   a second source or drain structure comprising an epitaxial structure at the second side of the gate stack, the epitaxial structure comprising a lower semiconductor layer and a capping semiconductor layer, the lower semiconductor layer of each of the epitaxial structures of the first and second source or drain structures in direct physical contact with the nanowire and comprising silicon, germanium and boron throughout an entirety of the lower semiconductor layer of the epitaxial structure, the capping semiconductor layer of the epitaxial structure of each of the first and second source or drain structures having a germanium concentration greater than the lower semiconductor layer; and
   an isolation structure laterally adjacent to one of the first source or drain structure or the second source or drain structure, wherein the one of the first source or drain structure or the second source or drain structure vertically overlaps the isolation structure.

8. The integrated circuit structure of claim 7, wherein the lower semiconductor layer of each of the epitaxial structures of the first and second source or drain structures have an atomic concentration of boron in the range of 1E20 atoms/cm$^3$-3E21 atoms/cm$^3$, and a germanium concentration in the range of 10% to 85%.

9. The integrated circuit structure of claim 7, wherein the first and second source or drain structures have a resistivity less than or equal to 0.3 mOhm·cm.

10. The integrated circuit structure of claim 9, wherein the resistivity of the first and second source or drain structures is in the range of 0.1 mOhm·cm to 0.3 mOhm·cm.

11. The integrated circuit structure of claim 7, wherein the capping semiconductor layer consists essentially of germanium.

12. The integrated circuit structure of claim 7, further comprising:
   first and second dielectric gate sidewall spacers along the first and second sides of the gate stack, respectively.

13. The integrated circuit structure of claim 7, further comprising:
   a first conductive contact on the capping semiconductor layer of the first source or drain structure; and
   a second conductive contact on the capping semiconductor layer of the second source or drain structure.

14. The integrated circuit structure of claim 13, wherein the first and second conductive contacts are in a partial recess in the capping semiconductor layers of the first and second source or drain structures, respectively.

15. An integrated circuit structure, comprising:
   a nanowire;
   a gate stack having a gate electrode, the gate electrode completely surrounding a channel region of the nanowire, the gate stack having a first side opposite a second side;

a first source or drain structure comprising an epitaxial structure at the first side of the gate stack, the epitaxial structure comprising a lower semiconductor layer and a capping semiconductor layer; and a second source or drain structure comprising an epitaxial structure at the second side of the gate stack, the epitaxial structure comprising a lower semiconductor layer and a capping semiconductor layer, the lower semiconductor layer of each of the epitaxial structures of the first and second source or drain structures in direct physical contact with the nanowire and comprising silicon, germanium and boron throughout an entirety of the lower semiconductor layer of the epitaxial structure, the capping semiconductor layer of the epitaxial structure of each of the first and second source or drain structures having a germanium concentration greater than the lower semiconductor layer;

an isolation structure laterally adjacent to one of the first source or drain structure or the second source or drain structure, wherein the one of the first source or drain structure or the second source or drain structure vertically overlaps the isolation structure;

a first conductive contact on the capping semiconductor layer of the first source or drain structure;

a second conductive contact on the capping semiconductor layer of the second source or drain structure;

a first dielectric spacer along sidewalls of the first conductive contact, wherein the capping semiconductor layer of the first source or drain structure is confined between the first dielectric spacer; and a second dielectric spacer along sidewalls of the second conductive contact, wherein the capping semiconductor layer of the second source or drain structure is confined between the second dielectric spacer.

16. The integrated circuit structure of claim 15, further comprising:

first and second dielectric gate sidewall spacers along the first and second sides of the gate stack, respectively.

17. The integrated circuit structure of claim 15, wherein the lower semiconductor layer of each of the epitaxial structures of the first and second source or drain structures have an atomic concentration of boron in the range of 1E20 atoms/cm$^3$-3E21 atoms/cm$^3$, and a germanium concentration in the range of 10% to 85%.

18. The integrated circuit structure of claim 15, wherein the first and second source or drain structures have a resistivity less than or equal to 0.3 mOhm·cm.

19. The integrated circuit structure of claim 18, wherein the resistivity of the first and second source or drain structures is in the range of 0.1 mOhm·cm to 0.3 mOhm·cm.

20. The integrated circuit structure of claim 15, wherein the capping semiconductor layer consists essentially of germanium.

* * * * *